(12) United States Patent
Song et al.

(10) Patent No.: US 10,512,196 B2
(45) Date of Patent: Dec. 17, 2019

(54) POWER THERMAL AWARENESS SOLUTION

(71) Applicant: Intel Corporation, Santa Clara, CA (US)

(72) Inventors: Chuan Song, ShangHai (CN); Nishi Ahuja, University Place, WA (US); Haifeng Gong, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/553,821

(22) PCT Filed: May 27, 2015

(86) PCT No.: PCT/CN2015/075231
§ 371 (c)(1),
(2) Date: Aug. 25, 2017

(87) PCT Pub. No.: WO2016/154803
PCT Pub. Date: Oct. 6, 2016

(65) Prior Publication Data
US 2018/0035572 A1    Feb. 1, 2018

(51) Int. Cl.
*H05K 7/20* (2006.01)
*G05B 13/04* (2006.01)
*G06F 1/20* (2006.01)

(52) U.S. Cl.
CPC ........ *H05K 7/20836* (2013.01); *G05B 13/04* (2013.01); *G06F 1/206* (2013.01); *H05K 7/20736* (2013.01); *Y02D 10/16* (2018.01)

(58) Field of Classification Search
CPC .......... H05K 7/20836; H05K 7/20736; G05B 13/04; G06F 1/206; Y02D 10/16
See application file for complete search history.

(56) References Cited

U.S. PATENT DOCUMENTS 8,140,195 B2 *   3/2012   Matteson ............... G06F 1/206
                                                          700/299
8,145,363 B2 *   3/2012   Bean, Jr. ............ H05K 7/20781
                                                          162/118

(Continued)

FOREIGN PATENT DOCUMENTS

CN        104142723 A      11/2014
CN        104238695 A      12/2014

(Continued)

OTHER PUBLICATIONS

International Preliminary Report on Patentability and Written Opinion issued in PCT Application No. PCT/CN2015/075231, dated Oct. 3, 2017, 5 pages.

(Continued)

*Primary Examiner* — Charles R Kasenge
(74) *Attorney, Agent, or Firm* — Grossman, Tucker, Perreault & Pfleger, PLLC

(57) ABSTRACT

One embodiment provides an apparatus. The apparatus includes power thermal awareness solution (PTAS) logic to select a model from a plurality of models based, at least in part, on a configuration of a cooling zone; and determine a cooling zone volumetric airflow based, at least in part, on the selected model.

15 Claims, 4 Drawing Sheets

(56) References Cited

U.S. PATENT DOCUMENTS

| | | | | |
|---|---|---|---|---|
| 8,164,434 | B2* | 4/2012 | Gross | G05B 13/048 340/501 |
| 8,825,451 | B2* | 9/2014 | VanGilder | G06F 17/5009 703/1 |
| 2005/0055590 | A1* | 3/2005 | Farkas | G06F 1/206 713/320 |
| 2006/0121421 | A1* | 6/2006 | Spitaels | G06F 1/206 434/118 |
| 2009/0296342 | A1* | 12/2009 | Matteson | G06F 1/206 361/679.46 |
| 2010/0305775 | A1* | 12/2010 | Bean, Jr. | G05B 19/042 700/300 |
| 2010/0315223 | A1* | 12/2010 | Gross | G05B 13/048 340/500 |
| 2012/0158387 | A1* | 6/2012 | VanGilder | G06F 17/5009 703/9 |
| 2012/0215373 | A1* | 8/2012 | Koblenz | G05D 23/1919 700/300 |
| 2012/0259583 | A1* | 10/2012 | Noboa | G05B 15/02 702/179 |
| 2014/0122033 | A1 | 5/2014 | VanGilder et al. | |

FOREIGN PATENT DOCUMENTS

| | | |
|---|---|---|
| JP | 2014238836 A | 3/2015 |
| WO | 2013070243 A1 | 5/2013 |
| WO | 2016-154803 A1 | 10/2016 |

OTHER PUBLICATIONS

International Search Report and Written Opinion issued in PCT Application No. PCT/CN2015/075231, dated Jan. 4, 2016, 7 pages.
Ahuja, N., et al.: "Real Time Monitoring and Availability of Server Airflow for Efficient Data Center Cooling", 29th IEEE SEMI-THERM Symposium, IEEE 2013, 5 pages.
"Power and Thermal Management in Rack Scale Architecture", Feb. 27, 2015, 21 pages.
Extended European Search Report received in Patent Application No. 15886790.3, dated Oct. 25, 2018, 9 pages.
Japanese Office Action received in Japanese Patent Application 2017-540892, dated May 30, 2019, 35 pages.
Chinese Office Action received in Chinese Patent Application 201580077056, dated Mar. 6, 2019, 35 pages.
Japanese Office Action received in Japanese Patent Application 2017-540892, dated May 30, 2019.
Office Action received in Japanese Patent Application 2017-540892, dated Dec. 1, 2018.
China Office Action from related matter CN201580077056.X dated Oct. 9, 2019.

* cited by examiner

POWER THERMAL AWARENESS SOLUTION

FIELD

The present disclosure relates to power thermal awareness, in particular to, a power thermal awareness solution.

BACKGROUND

Data centers typically include several rows of racks that house compute, memory, storage and/or networking elements. During operation, the elements consume electrical energy related to their operation and produce heat related to the consumed electrical energy. A data center management system is configured to cool the elements by supplying cool air to, and removing heated air from, the racks. Providing cooling adds to power consumption of the data center and thus, affects overall energy efficiency of the data center. Providing more cooling than necessary corresponds to wasted energy and providing inadequate cooling can degrade system reliability due to overheating.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
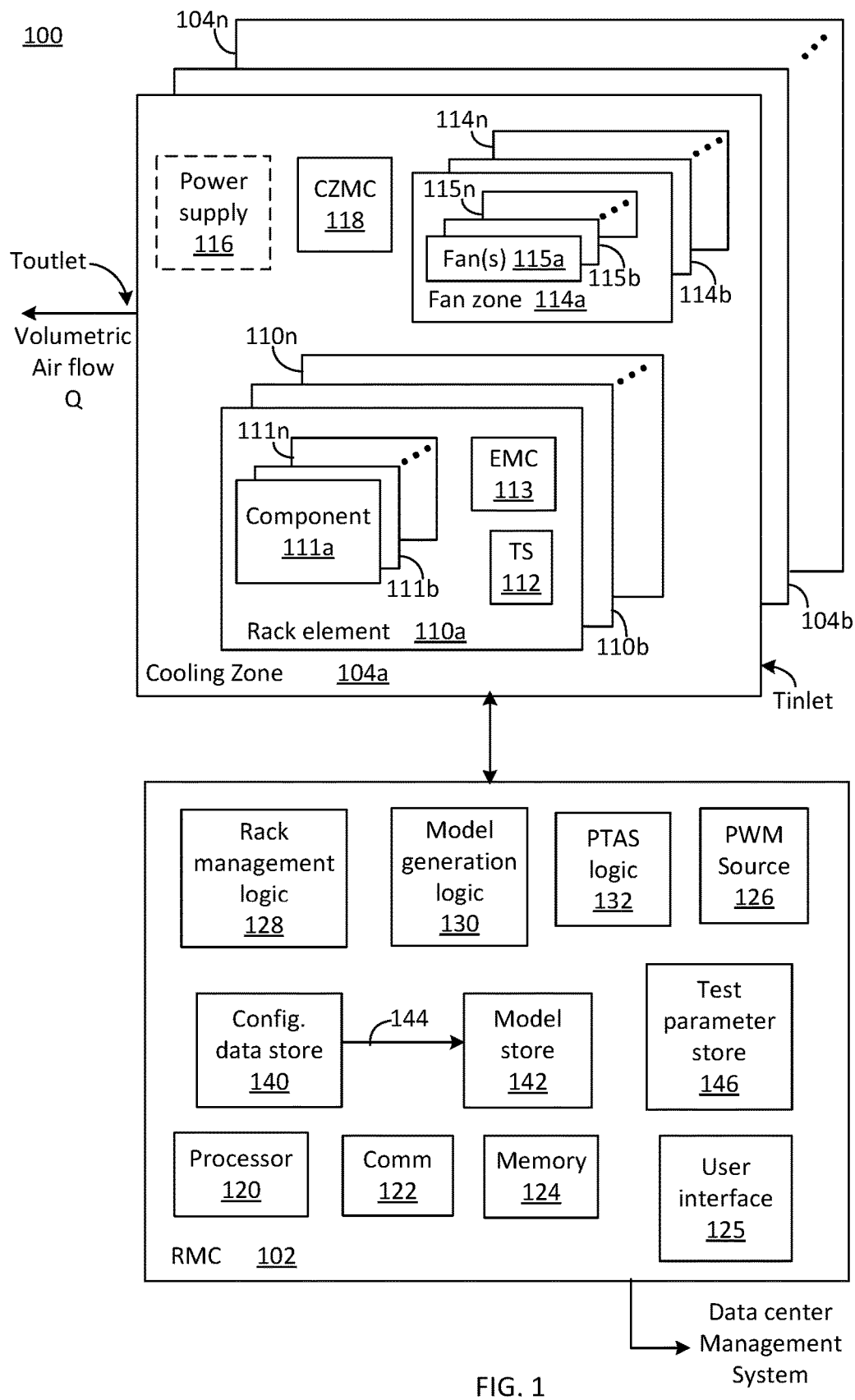
FIG. 1 illustrates a functional block diagram of a power thermal awareness system consistent with various embodiments of the present disclosure.

Although the following Detailed Description will proceed with reference being made to illustrative embodiments, many alternatives, modifications, and variations thereof will be apparent to those skilled in the art.

DETAILED DESCRIPTION

Energy efficiency of a data center may be improved by relating (e.g., matching) cooling airflow provided by the data center to cooling needs of rack elements. A rack includes a plurality of rack elements and each rack element may include a plurality of components. Localized cooling of rack elements and associated components is typically provided by one or more fan(s) grouped in one or more fan zone(s) configured to provide a cooling airflow through a cooling zone that contains one or more rack elements. Cooled air at an inlet temperature (Tinlet) may be input to the cooling zone and a volumetric airflow (Q) at an outlet temperature (Toutlet) may be output from the cooling zone. Toutlet is typically greater than Tinlet with a difference related to heat produced by the components contained in the cooling zone. The magnitude of Q is related to number of fan zones, fan characteristics and a cooling zone configuration (e.g., impedance). Toutlet is related to Tinlet, Q and power consumption (P) of components contained in the cooling zone. P may vary over time due to, for example, operations of the components. Providing the volumetric airflow, Q, and outlet temperature, Toutlet, for each cooling zone to a data center management system may facilitate determination by the data center management system of an appropriate amount of cooling (i.e., supply volumetric airflow and supply air temperature) to be provided to each cooling zone. Energy efficiency in the data center may thus be improved.

A rack may be configured with a plurality of rack elements at initial provisioning. Impedance of each cooling zone is related to the specific components included in each rack element, physical configuration of those components and a physical arrangement of rack elements. Volumetric airflow for a cooling zone may be modeled as a function of fan speed(s) and cooling zone configuration. The model may be generated a priori based, at least in part, on experimental data (i.e., volumetric airflow) captured from, e.g., a wind tunnel. The model may then be utilized during operation to determine volumetric airflow as a function of fan speed(s).

During operation, rack elements may be replaced, i.e., after initial provisioning. In a rack scale architecture (RSA), for example, a user may replace rack element(s) in response to a change in functional requirements such as a need for more storage and/or less processing capacity. Replacing rack elements may affect cooling zone impedance, thus, the model related to the cooling zone impedance at initial provisioning may no longer be accurate.

Generally, this disclosure relates to a power thermal awareness solution. A power thermal awareness solution (PTAS) is configured to determine a volumetric airflow for a cooling zone. A plurality of models may be generated a priori (i.e., prior to initial provisioning of rack elements). Each model is configured to relate cooling fan speed(s) of one or more fan(s) grouped in each of one or more fan zone(s) and respective cooling zone configuration to volumetric airflow for the respective cooling zone. The plurality of models is configured to accommodate changes to cooling zone configuration(s) that may occur after initial provisioning, as described herein. An appropriate model may then be selected during operation based, at least in part, on a configuration of a target cooling zone. The volumetric airflow may be determined based, at least in part, on the selected model. The PTAS is further configured to determine an outlet airflow temperature for the cooling zone based, at least in part, on the determined volumetric airflow.

A rack includes a frame, one or more fan(s) and one or more rack element(s). Each rack element may correspond to a tray (i.e., drawer) and/or a server node (i.e., chassis). Each rack element may include one or more component(s), an element management controller and/or a temperature sensor. A cooling zone may contain one or more rack element(s) and at least one fan zone that contains at least one of the fan(s). A cooling zone may correspond to at least a portion of a rack. The rack may include a power supply. The fan(s), rack element(s) and power supply may be mechanically coupled to the rack frame.

A rack element may correspond to a fixed configuration or a variable configuration. In a fixed configuration, the component(s) and a physical arrangement of the component(s) relative to cooling fan(s) may not be changed by a user, i.e., may not be changed after initial provisioning. In a variable configuration, the component(s) and/or a physical arrangement of the component(s) relative to cooling fan(s) may be changed, e.g., by a user, after initial provisioning. Changes in the component(s) and/or physical arrangement may correspond to changes in impedance of the cooling zone and corresponding changes in cooling zone volumetric airflow produced by the fans. Thus, replacing a first rack element with a second, different rack element may change the impedance of the cooling zone, and the relationship between fan speed and Q.

For example, a server chassis may generally correspond to a fixed configuration. Each server chassis may include a processor, memory, networking capability, a temperature sensor and one or more cooling fan(s). A server chassis initially provisioned in a rack may be replaced but, since the cooling fan(s) are included in the server chassis, physical arrangement of the cooling fan(s) relative to the components contained in the server chassis may remain fixed.

In another example, a tray, in e.g., a rack scale architecture, may generally correspond to a variable configuration. Each tray is configured to be cooled by one or more fan(s) included in the rack, e.g., coupled to a rack frame. Each tray may include one or more sled(s). Each sled may include one or more compute component(s), memory component(s), storage component(s) and/or networking component(s), as described herein. Initially provisioned tray(s) and/or sled(s) may be replaced by a user after initial provisioning. Since at least some cooling fans are not included in the tray, the components included in the tray(s) and/or sled(s) and/or their physical arrangement relative to the rack mounted cooling fan(s) may change. Thus, a cooling zone impedance may also change.

Generally, fan performance may be characterized by static pressure versus airflow. Airflow is related to fan speed and fan speed is related to input power to the fan. Input power to the fan may be controlled by controlling a duty cycle of a pulse width modulated (PWM) signal (e.g., supply voltage) provided to the fan. Ideally, fan speed is proportional to the duty cycle of the PWM signal. In reality, mechanical characteristics of a fan, e.g., mass, torque characteristics of fan motor and frictional losses, may introduce error between PWM duty cycle and fan speed, for a fan operating open loop. Further, for a selected fan and a selected fan speed, resulting airflow is related to cooling zone impedance (i.e., resistance to airflow). For example, an increase in cooling zone impedance corresponds to a decrease in airflow for a given pressure and a decrease in cooling zone impedance corresponds to an increase in airflow for the given pressure. In cooling zone configurations that include a plurality of fans, interactions between the plurality of fans may further affect resulting airflow of each fan.

Volumetric airflow associated with a cooling zone configuration may be determined experimentally using, for example, a wind tunnel. For example, a rack configured with rack element(s), fan(s) and power supply that corresponds to cooling zone configuration(s) to be tested may be coupled to the wind tunnel. PWM duty cycle(s) of input signal(s) provided to one or more of the fan(s) included in the cooling zone may be set and/or adjusted. The one or more fan(s) may be grouped in one or more fan zone(s). All of the fans in a respective fan zone are configured to receive an input signal with a same PWM duty cycle. Resulting fan speeds and the volumetric airflow may be measured. Respective airflows produced by each of a plurality of cooling fans may combine to yield a volumetric airflow for the cooling zone. For a specific cooling zone configuration, a model relating fan speed(s) to volumetric airflow may be generated based, at least in part, on the acquired experimental data. For example, the generated model may be related to a weighted sum of fan speed(s) associated with each fan zone, singly and/or in combination. During operation, a cooling zone configuration may be identified and a corresponding model selected based, at least in part, on the identified cooling zone configuration. Volumetric airflow may then be determined during operation based, at least in part, on detected fan speed(s), using the selected model.

Thus, a respective model relating volumetric airflow and fan speeds may be generated, a priori, for each cooling zone configuration. An appropriate model may be selected during operation based, at least in part, on cooling zone configuration data. Volumetric airflow may then be determined based, at least in part, on detected fan speed(s). The outlet airflow temperature (Toutlet) may then be determined based, at least in part, on the determined volumetric airflow, as described herein. Thus, dynamic configuration changes may be accommodated. The outlet temperature and volumetric airflow may then be provided to the data center management system, thus, facilitating management of data center cooling.

It is contemplated that the outlet temperature and volumetric airflow information from a plurality of cooling zones (and a plurality of racks) may allow the data center management system to build prediction models related to power consumption and thermal characteristics. Workload balancing may then be implemented across racks and/or cooling zones based, at least in part, on the prediction models, power consumption and/or volumetric airflow information, to further improve efficiency.

FIG. 1 illustrates a functional block diagram of a power thermal awareness system 100 consistent with various embodiments of the present disclosure. System 100 includes a rack management controller (RMC) 102 and one or more cooling zone(s) 104a, 104b, . . . , 104n. Prior to provisioning system 100 in a data center, RMC 102 is configured to facilitate model generation. Model generation includes acquiring configuration data related to a cooling zone, providing control inputs to one or more fan(s) included in the cooling zone, capturing test data for each test trial and acquiring and storing sets of model parameters for each cooling zone configuration modeled. Each set of model parameters may then correspond to a respective model. After provisioning, i.e., during operation, RMC 102 is configured to identify a respective configuration of each cooling zone and to select a corresponding model. RMC 102 is further configured to acquire fan speed(s), inlet temperature(s) and power consumption associated with each cooling zone and to determine a volumetric airflow, Q. RMC 102 is further configured to determine outlet airflow temperature (Toutlet) associated with each cooling zone based, at least in part, on the respective volumetric airflow, Tinlet and power consumption. RMC 102 is further configured to provide Toutlet and/or Q to a data center management system. Thus, a model comprising model parameters related to a current cooling zone configuration may be utilized to determine volumetric airflow.

RMC 102 may include a processor 120, a communication logic 122 and a memory 124. Processor 120 is configured to perform operations of RMC 102. Processor 120 may include one or more processor core(s), i.e., processing unit(s). Communication logic 122 is configured to communicate commands and/or data to and/or from one or more of cooling zone(s) 104a, 104b, . . . , 104n. For example, communication logic 122 may be configured to communicate with the cooling zone using out of band (OOB) communication, as described herein. Communication logic 122 is further configured to communicate an outlet temperature and/or a volumetric airflow from RMC 102 to a data center management system. Communication logic 122 may be configured to receive request(s) from the data center management system for a current Toutlet temperature and/or a current volumetric airflow. For example, communication between RMC 102 and cooling zones 104a, 104b, . . . , 104n and/or the data center management system may be via an application programming interface (API). RMC 102 may then appear as a volumetric airflow sensor and/or a Toutlet temperature sensor to, e.g., the data center management system. Memory 124 is configured to store one or more of logic, data, models and/or parameter(s).

In some embodiments, RMC 102 may include a user interface 125 and a PWM source 126. The user interface 125 is configured to facilitate receiving configuration data from a user, as described herein. The PWM source 126 is configured to provide one or more PWM signals to cooling zone(s) 104a, 104b, . . . , 104n. A duty cycle of each PWM signal is related to a respective fan speed of one or more fan(s) included in a selected fan zone associated with a cooling zone, e.g., cooling zone 104a.

Each cooling zone, e.g., cooling zone 104a, includes one or more rack element(s) 110a, 110b, . . . , 110n, one or more fan zone(s) 114a, 114b, . . . , 114n and a cooling zone management controller (CZMC) 118. At least one cooling zone, e.g., cooling zone 104a, may include a power supply 116. Each fan zone, e.g., fan zone 114a, includes one or more fan(s) 115a, 115b, . . . , and/or 115n. A maximum number of fan zones is equal the number of fans, i.e., one fan per fan zone. A minimum number of fan zones is one. Each rack element, e.g., rack element 110a, includes one or more component(s) 111a, 111b, . . . , 111n, a temperature sensor 112 and an element management controller (EMC) 113.

The fan(s) of each fan zone, e.g., fan(s) 115a, 115b, . . . , and/or 115n of fan zone 114a, are configured to receive a PWM input signal with a respective same duty cycle. A fan may include one or more rotor(s). For example, a dual rotor fan may correspond to two fans coupled in series and configured to receive a same PWM input signal. Dual rotor fans may be utilized in systems that have a relatively high impedance, i.e., may maintain a given airflow at an increased pressure. All of the fan(s) in a fan zone, e.g., fan zone 114a, are configured to be driven by a PWM input signal with a same duty cycle. For example, the fan(s) of each fan zone may be configured to receive a PWM input signal from CZMC 118 and/or PWM source 126. The rotational speed, i.e., fan speed, in revolutions per minute (RPM) of each fan in a selected fan zone is related to the PWM input signal.

The component(s) 111a, 111b, . . . , 111n may include, but are not limited to, compute, memory, storage and/or networking component(s), etc. For rack elements that correspond to server chassis, the component(s) 111a, 111b, . . . , 111n may include a processor, memory, networking capability and storage. Compute components include processors that may include one or more core processing elements and may include local memory (e.g., cache, non-volatile memory (NVM), volatile memory). Memory components include NVM and/or volatile memory. Storage components may include solid state drives, hard disk drives, removable storage media, etc. The networking components may be configured to communicate electrically and/or optically and are configured to provide connectivity between rack elements, between racks and/or between a rack and the data center management system.

One or more of the compute component(s), memory component(s), storage component(s) and/or networking component(s) may produce heat during operation. The temperature sensor 112 is configured to detect a temperature related to cooling zone inlet temperature Tinlet. A cooling zone, e.g., cooling zone 104a, that contains a plurality of rack elements 110a, 110b, . . . , 110n may contain a plurality of temperature sensors. In an embodiment, CZMC 118 may be configured to acquire and/or average the temperature readings from the plurality of temperature sensors.

EMC 113 is configured to detect a power consumption of rack element 110a and to provide the power consumption to, e.g., RMC 102 and/or CZMC 118. For example, the power consumption may be provided to RMC 102 via CZMC 118. For example, EMC 113 may correspond to a baseboard management controller (BMC) or a management engine (ME). In another example, EMC 113 may correspond to a Tray Management Controller (TMC) or a pooled system management engine (PSME). In another example, CZMC 118 may correspond to a rack management backplane controller (RMBC). Generally, management controllers (MCs) and/or management engines (MEs) are configured to provide local control and/or communication for rack elements and/or cooling zones. For example, MCs and MEs may be configured to detect configuration information and/or status information and to provide such information to an upstream management controller.

The fan(s) of each fan zone, e.g., fan(s) 115a, 115b, . . . , and/or 115n of fan zone 114a, are configured to provide airflow through cooling zone 104a to cool one or more component(s) of one or more of rack element(s) 110a, 110b, . . . , 110n, e.g., component(s) 111a, 111b, . . . , 111n of rack element 110a. One or more of component(s) 111a, 111b, . . . , 111n may produce heat during operation. An amount of heat produced may be related to power consumption and/or workload of component(s) 111a, 111b, . . . , 111n. Fan(s) 115a, 115b, . . . , and/or 115n of fan zone 114a are configured to receive a PWM input signal with a same duty cycle, as described herein. One or more of the fan(s) 115a, 115b, . . . , and/or 115n may further provide cooling airflow to EMC 113.

One or more of the fan(s) 115a, 115b, . . . , and/or 115n may be mechanically coupled to a rack frame, i.e., may not be included in rack elements 110a, 110b, . . . , 110n. In some embodiments, e.g., for rack elements that correspond to server chassis, at least one fan may be contained in the rack element. Each fan 115a, 115b, . . . , and/or 115n is configured to receive a respective PWM input signal related to a target fan speed for the respective fan. Airflow produced by each fan is related to respective fan speed, as described herein.

CZMC 118 may be configured to receive thermal information from one or more of temperature sensor(s), e.g., temperature sensor 112, and/or to acquire power consumption information from one or more of component(s) 111a, 111b, . . . , 111n, e.g., via EMC 113. A duty cycle of the PWM input signal(s) from CZMC 118 may then be based, at least in part, on the thermal information and/or power consumption information. Thus, in operation, respective fan speed and related fan airflow may be adjusted based, at least in part, on PWM input signal(s) from CZMC 118 providing closed loop control of PWM duty cycle based on temperature. A resulting volumetric airflow Q is related to a combination of respective airflows produced by each of the one or more fan(s), e.g., fan(s) 115a, 115b, . . . , 115n, and fan zone(s) 114a, 114, . . . , 114n. Volumetric airflow Q is further related to a cooling zone configuration, e.g., cooling zone impedance, as described herein.

RMC 102 includes rack management logic 128, model generation logic 130 and PTAS logic 132. Rack management logic 128 is configured to manage operation of a rack that includes one or more cooling zones, e.g., cooling zone 104a. Model generation logic 130 is configured to support a priori determination of respective sets of model parameters for each cooling zone configuration modeled. PTAS logic 132 is configured to select an appropriate model, i.e., set of model parameters, based, at least in part, on current cooling zone configuration data and to determine volumetric airflow and Toutlet, as described herein.

Rack management logic 128 is configured to receive volumetric airflow and/or Toutlet for each of cooling zone(s) 104a, 104b, ..., 104n, e.g., from one or more cooling zone management controller(s), e.g., CZMC 118. In an embodiment, rack management logic 128 may then provide the received volumetric airflow and/or Toutlet to the data center management system. In another embodiment, rack management logic 128 may combine the received volumetric airflows from a plurality of cooling zones 104a, 104b, ... m 104n. For example, the volumetric airflows may be combined if the respective outlet temperatures are relatively close in value. Thus, the data center management system may be provided volumetric airflow and Toutlet for each of the cooling zone(s) 104a, 104b, ..., and/or 104n and/or a combined volumetric airflow and Toutlet.

RMC 102 may include configuration data store 140, model store 142 and a test parameter store 146. Configuration data store 140 is configured to store configuration data set(s), as described herein. Model store 142 is configured to store model(s) (i.e., set(s) of model coefficients), as described herein. One or more configuration data set(s) may be related to each model by a configuration identifier (ID) 144. For example, configuration data store 140 may include individual configuration data sets for each of a plurality of cooling zone configurations. Each configuration data set may then be associated with a respective configuration ID. Model store 142 may include models for each of the plurality of cooling zone configurations. Each model may then be associated with the respective configuration ID.

Model generation logic 130 is configured to generate a respective model relating volumetric airflow, Q, to fan speed(s), $s_i$, for a selected cooling zone configuration. Generally, the volumetric airflow, Q, is related to the cooling zone configuration (e.g., impedance) of the selected cooling zone and to the fan speed(s) of fan(s) associated with the selected cooling zone. Impedance of the cooling zone is related to cooling zone configuration. Cooling zone configuration is related to rack element(s) and associated component(s) contained in the cooling zone and their physical arrangement. Cooling zone configuration may then correspond to cooling zone configuration data. Cooling zone configuration data includes a plurality of cooling zone parameters and their respective values. In other words, cooling zone configuration data may be utilized to identify a target cooling zone, as described herein.

Cooling zone configuration data includes number of fan zone(s) associated with the cooling zone and number, fan type and fan characteristics for each fan associated with a respective fan zone. Cooling zone configuration data may further include data related to location of each fan, e.g., included in a rack element and/or mounted to a rack frame and/or position in the rack. Cooling zone configuration data may further include an indicator whether a rack power supply 116 is included in the cooling zone and, if so, cooling zone configuration data may include rack power supply data and rack power supply cooling fan data.

Cooling zone configuration data includes size of cooling zone, structure of cooling zone and number and type of rack element(s) included in the cooling zone. Rack element type may include single server node, multiple-server node, tray(s)/drawer(s) and/or a combination thereof. Cooling zone configuration data further includes configuration data for each rack element type. Configuration data for a single server node includes, but is not limited to, processor type, memory type, number and type of cooling fans, etc. Configuration data for a multiple-server node rack element includes, but is not limited to, the configuration data for a single server node (for each server node contained in the multiple-server node) a presence indicator for each server node, etc.

Configuration data for a tray type rack element includes, but is not limited to, a tray type, a tray presence indicator, a number of sleds that may be included in each tray, etc. Configuration data for each sled includes, but is not limited to, a sled type, a sled presence indicator, sled contents, etc. Sled contents may include, but are not limited to, number and type of compute component(s) (e.g., processor(s), size and type of memory), number, size and type of storage component(s) (e.g., solid state drive(s), hard disk drive(s), removable media), networking component(s), etc.

Configuration data for a cooling zone configuration may be received by model generation logic 130 from a user via, e.g., user interface 125. Configuration data may be further requested from one or more of EMC 113, CZMC 118 and/or rack management logic 128. The configuration data may then be stored in configuration data store 140. A respective configuration ID may be associated with the received configuration data for each cooling zone configuration and stored with associated configuration data in configuration store 140. The configuration ID 144 may then be utilized as an index related to a model (i.e., a set of model parameters) stored in model store 142, as described herein.

It may be appreciated that airflow produced by a fan is related to fan speed, $s_i$, where $s_i$ is in RPM, i corresponds to fan zone i that includes the fan and i=1, 2, ..., n. Volumetric airflow $Q_k$ for a cooling zone configuration (e.g., cooling zone configuration k) that includes one or more fan(s) in one or more fan zone(s) is related to the airflows produced by the fan(s) and impedance of the cooling zone, i.e., configuration of the cooling zone. The relationship of cooling zone volumetric airflow $Q_k$ to the airflows produced by the fan(s) may be modeled as a combination of weighted fan speed(s) and an independent term. The weight(s), $c_j$, correspond to multiplicative coefficients of fan speed(s) $s_i$ and the independent term. As used herein, "weight", "coefficient", "model coefficient" and "model parameter" correspond to elements of a model. The independent term may represent a rack power supply fan and may be a constant or a product of power supply fan speed and or factor, as described herein.

The number of coefficients is related to a number of fan zone(s) included in the cooling zone and the configuration of the cooling zone. For example, the volumetric airflow for a cooling zone that includes n fan zones may include $2^n$ coefficients. Each fan zone may contain one or more fan(s). Each fan included in a specific fan zone is configured to receive a PWM input signal with a same duty cycle.

In a first example, the volumetric airflow for a single fan zone cooling zone may be modeled as $$Q_1 = c_1 * s_1 + c_2.$$

In this first example, the volumetric airflow for a one fan zone cooling zone is a linear combination of weighted fan speed $s_1$ and the independent term $c_2$. The independent term may represent a power supply fan, if present. In a second example, the volumetric airflow for a two fan zone cooling zone may be modeled as $$Q_2 = c_1 * s_1 + c_2 * s_2 + c_3 * s_1 * s_2 + c_4.$$

In a third example, the volumetric airflow for a three fan zone cooling zone may be modeled as $$Q_3 = c_1*s_1 + c_2*s_2 + c_3*s_3 + c_4*s_1*s_2 + c_5*s_1*s_3 + c_6*s_2*s_3 + c_7*s_1*s_2*s_3 + c_8.$$

In a fourth example, the volumetric airflow for a four fan zone cooling zone may be modeled as $$Q_4 = c_1*s_1 + c_2*s_2 + c_3*s_3 + c_4 s_4 + c_5*s_1*s_2 + c_6*s_1*s_3 + c_7*s_1*s_4 + c_8*s_2*s_3 + c_9*s_2*s_4 + c_{10}*s_3*s_4 + c_{11}*s_1*s_2*s_3 + c_{12}*s_1*s_2*s_4 + c_{13}*s_2*s_3*s_4 + c_{14}*s_1*s_3*s_4 + c_{15}*s_1*s_2*s_3*s_4 + c_{16}.$$

Thus, a general model relating fan speed(s) to volumetric airflow may include a sum of weighted individual fan speeds for each fan zone plus a sum of weighted fan speed cross terms (i.e., products of fan speeds) plus the independent term. In some embodiments, fewer than all of the cross terms may be included in the model, as described herein.

In some embodiments, one or more of the fan(s) may include a plurality rotors with each rotor coupled to an associated fan blade. For example, the plurality of fans may be coupled in series. Fans coupled in series may provide relatively better volumetric flow for a cooling zone with a relatively high impedance. The rotational speeds of the fan blades may or may not be equal. If the rotational speeds are not equal, a highest fan speed may be utilized in the model when determining the coefficient values.

A cooling zone may include one or more fan zone(s) and each fan zone may include one or more fan(s). In some embodiments, a fan zone may include a plurality of fans. Although the plurality of fans is configured to receive a PWM input signal with a same duty cycle, resulting fan speeds may vary across the plurality of fans. In these embodiments, one fan speed may be selected for $s_i$ for the fan zone. For example, the selected fan speed may correspond to a maximum detected fan speed of the plurality of fan speeds. In another example, the selected fan speed may correspond to an average of the detected fan speeds for the fan zone. Thus, a fan zone is configured to account for one or more fan(s) and may simplify determination of model parameters and/or determination of volumetric airflow using the model. In other words, relatively fewer fan zones than fans may correspond to a volumetric airflow model with relatively fewer terms and thus, relatively fewer coefficients.

The independent term, i.e., $c_2$ for $Q_1$, $c_4$ for $Q_2$, $c_8$ for $Q_3$ and $c_{16}$ for $Q_4$, may be configured to account for airflow related to a power supply, e.g., power supply 116. For example, the independent terms may be used to model the power supply region airflow when a power supply fan speed is not measured. In this example, the independent term may be a constant. In another example, the independent term may be replaced by a weighted power supply fan speed, e.g., $c_{16}*s_5$, where $s_5$ is the fan speed of the power supply fan and $c_{16}$ represents the contribution of the power supply fan to the volumetric airflow for the cooling zone.

Cross-terms (i.e., weighted products of fan speeds, e.g., $c_3*s_1*s_2$, etc.) are configured to account for interactions in airflow between fans and/or fan zones. For some cooling zone (and fan zone) configurations, a fan speed of a first fan may be affected by airflow from one or more other fan(s). The cross-terms are configured to capture such interactions and such interactions may or may not be present. Such interactions may typically occur between fans and/or fan zones that are relatively near, e.g., adjacent, one another. For some cooling zone configurations, one or more of the coefficients may be at or near zero. For example, cross-terms may be at or near zero for fans (and/or fan zones) that are not adjacent and/or are relatively distant from one another.

It is contemplated that, in some embodiments, a plurality of fan zones may be combined into one or more composite fan zones. Thus, a cooling zone that includes a plurality of fan zones may include one or more composite fan zones. In these embodiments, a composite fan speed may be determined for each composite fan zone. For example, the composite fan speed may correspond to a maximum fan speed of the fans included in the composite fan zone. In another example, the composite fan speed may correspond to an average of the maximum fan speeds of the respective fan zones. In another example, the composite fan speed may correspond to an average of the fan speeds of the fans included in the composite fan zone. The composite fan speed(s) may then be utilized to determine one or more model coefficients, as described herein. Such composite fan zones are configured to reduce a number of model coefficients and to, thus, simplify generation of the model coefficients and/or determination of volumetric airflow, as described herein. It is further contemplated that, in these embodiments, a total number of models may be reduced since a model that includes relatively fewer model coefficients may more easily correspond to a plurality of cooling zone configurations than a model that includes relatively more model coefficients. Reducing the total number of models may simplify model selection, as described herein.

Model generation logic 130 is configured to facilitate data acquisition to support determination of the coefficients $c_1$ for one or more selected cooling zone configuration(s). The coefficients may be determined a priori, i.e., prior to provisioning in the data center. For example, a rack configured with rack element(s), fan(s) and power supply that corresponds to cooling zone configuration(s) to be tested may be positioned relative to a wind tunnel. In some embodiments, the rack may be fully provisioned to facilitate capturing airflow interactions between adjacent cooling zones. In these embodiments, such interactions may then be captured, if such interactions exist.

Model generation logic 130 is configured to receive cooling zone configuration data for a selected cooling zone configuration. For example, model generation logic 130 may be configured to request cooling zone configuration data from a management controller associated with the selected cooling zone, e.g., EMC 113, CZMC 118 and/or rack management logic 128. In another example, cooling zone configuration data may be received from a user, e.g., via user interface 125. Model generation logic 130 may then be configured to associate the received configuration data with a configuration ID.

For example, configuration data may be represented by a vector of numeric values. Each value may correspond to a configuration data point. For example, presence or absence of a rack element, tray and/or sled may be represented by a one or a zero, respectively. In another example, a type of component, e.g., compute, storage, etc., may be represented by a respective numeric value. Each element in the vector may then represent a selected configuration parameter. Thus, each configuration may be represented by a respective vector of numeric values. Each vector may be associated with a configuration identifier (ID). The configuration ID may be utilized as an index into model store 142, as described herein.

Model generation logic 130 may be configured to receive test parameters for a cooling zone configuration from a user via, e.g., user interface 125. The test parameters may then be stored in test parameter data 146. For example, the test parameters may include PWM duty cycle(s), PWM frequency(ies), a number of test trials, a test duration, etc.

For each test trial, model generation logic 130 is configured to set a duty cycle of a respective PWM signal for each fan zone 114a, 114b, . . . , 114n included in the selected cooling zone configuration. All of the fan(s) included in a fan zone may be configured to receive a PWM signal with a same duty cycle. For example, model generation logic 130 may be configured to control PWM source 126 to set the duty cycle(s). Initially, the respective duty cycles may be set to an initial value. For example, the initial value may correspond to a minimum duty cycle for the model generation operations. For example, the minimum duty cycle may be 25 percent (%). In another example, the minimum duty cycle may be greater than 25%.

PWM source 126 may be coupled to CZMC 118 and/or the fan(s) in each fan zone, e.g., 115a, 115b, . . . , 115n of fan zone 114a, during model generation operations. CZMC 118 may be configured to drive fan(s) in the respective fan zone(s) 114a, 114b, . . . , 114n based, at least in part, on the PWM signal(s) received from PWM source 126. The fan speed(s) associated with each fan zone 114a, 114b, . . . , 114n are related to the respective duty cycle of the corresponding PWM signal, as described herein. The model generation logic 130 may then be configured to acquire (e.g., capture) a respective resulting fan speed for each fan included in each fan zone in the selected cooling zone, e.g., cooling zone 104a. The model generation logic 130 is further configured to acquire a volumetric airflow for the selected cooling zone. The volumetric airflow may be acquired from, for example, a wind tunnel coupled to the selected cooling zone. The fan speed(s), PWM duty cycle and configuration ID may then be associated with a test trial index (t) and stored in test parameter store 146.

For each test trial t, the duty cycle of the PWM signal input to a selected fan zone may be adjusted and the resulting fan speeds for each fan and volumetric airflow for the cooling zone may be acquired. In other words, each test trial t may correspond to a unique combination of PWM duty cycle settings for the associated fan zones. Adjusting a PWM duty cycle of a selected fan zone is configured to adjust an associated fan speed of each fan included in the selected fan zone.

Fan speeds may not be independent of each other. Changes in the associated fan speed due to adjusting the PWM duty cycle may result in related changes in other fan speeds, for example, due to pressure changes related to the change in associated fan speed. Further, respective fan speeds of each fan in a selected fan zone may differ even though each fan is receiving a PWM input signal with the same duty cycle. Such differences may be related to different pressures and/or impedances experienced by each fan and/or different fan characteristics, as described herein.

The PWM duty cycle values are in the range of zero (i.e., fan off) to 100 percent (i.e., fan full on corresponding to a maximum fan speed for the fan). For example, the PWM duty cycle test values may correspond to a portion of the range of possible duty cycle values. In another example, the PWM duty cycle test values may be related to a range of duty cycle values that may be used during operation. For example, the PWM duty cycle test values may be in the range 25 to 60. Continuing with this example, four PWM duty cycle test values in this range may include 25, 35, 40 and 60. In another example, PWM duty cycle test values may be in the range of 25 to 80. Continuing with this example, three PWM duty cycle test values in this range may include 25, 50 and 80.

A number of test trials, N, is related to a number, v, of PWM duty cycle values and the number, n, of fan zones. For example, N may be equal to v raised to the power of n (i.e., $N=v^n$). In other words, each test trial yields a corresponding equation for volumetric airflow with the weights (i.e., coefficients) $c_j$ as unknowns. If the coefficients are independent (e.g., uncorrelated), a minimum number of equations that is equal to the number of coefficients may be adequate to uniquely determine the coefficients. Since the number of coefficients generally corresponds to two raised to a power equal to the number of fan zones, i.e., $2^n$, and the number of equations equals the number of trials, i.e., $v^n$, the minimum number of duty cycle values, $v_{min}$ may then be two. Thus, the number of PWM duty cycle values may be greater than or equal to two. Increasing the number of PWM duty cycle values to greater than the minimum yields a greater number of equations and may enhance accuracy of the model. For example, for a three fan zone cooling zone (n=3), the equation for volumetric airflow, $Q_3$, includes $2^3=8$ coefficients. Selecting v equal to two PWM duty cycle values yields eight test trials and selecting v equal to three yields $3^3=27$ test trials.

Each test trial t, t=1, 2, . . . , N, may then yield a measured volumetric airflow $Q_t$ for a selected cooling zone configuration and at least one captured fan speed, $s_{xt}$, x=1, 2, . . . , the number of fans, for each fan zone related to the selected cooling zone. For a fan zone that includes a plurality of fans, the plurality of fan speeds may be captured. Fewer than the plurality of fan speeds may be used to generate an associated prediction. In an embodiment, one fan speed may be selected. For example, the selected fan speed may correspond to a maximum fan speed of the plurality of detected fan speeds associated with that fan zone. In another example, the selected fan speed may correspond to an average of the detected fan speeds for that fan zone.

For example, for a three fan zone cooling zone each test trial t may yield $Q_t$, $s_{1t}$, $s_{2t}$ and $s_{3t}$. A corresponding prediction may then be generated as:

$$V_t = c_1 * s_{1t} + c_2 * s_{2t} + c_3 * s_{3t} + c_4 * s_{1t} * s_{2t} + c_5 * s_{1t} * s_{3t} + c_6 * s_{2t} * s_{3t} + c_7 * s_{1t} * s_{2t} * s_{3t} + c_8,$$

where $V_t$ is a volumetric airflow computed (i.e., predicted) for test trial t. For four PWM duty cycle test values, t=1, 2, . . . , N and N=64. Thus, in this example (i.e., three fan zones, four PWM duty cycle test values), the test trials may yield 64 equations (i.e., data sets) with eight unknowns (coefficients $c_1$, $c_2$, . . . , $c_8$).

Generally, coefficients may be determined based at least in part, on test trial data using, for example, a least sum squared error technique. The least sum squared error technique is configured to determine the coefficients that minimize a sum of the squares of the error between the measured volumetric airflow $Q_t$ and the corresponding prediction $V_t$. In other words, the technique is configured to determine the coefficients that minimize E where:

$$E = \sum_{t=1}^{N} e_t^2 = \sum_{t=1}^{N} (Q_t - V_t)^2$$

Thus, $e_t$ corresponds to the error between the volumetric airflow produced by the model, $Q_t$, and the measured (i.e., predicted) volumetric airflow, $V_t$, for each test trial t, t=1, 2, . . . , N. E, the sum of the squared errors, may be minimum when each first partial derivative of E with respect to a respective coefficient $c_j$ is zero, i.e., $\partial E/\partial c_j = 0$ for j=1, . . . , M where $M=2^n$=number of coefficients, $c_j$. Further, $$\frac{\partial E}{\partial c_j} = \sum_{t=1}^{N} 2(Q_t - V_t) \frac{\partial (Q_t - V_t)}{\partial c_j}$$

for each j=1, . . . , M.

Continuing with the three fan zone cooling zone example, the equation for partial derivative of the sum of the squared errors with respect to the coefficients, $c_j$, yields eight equations with eight unknowns (i.e., coefficients $c_1, c_2, \ldots, c_8$ included in $V_t$):

$$\frac{\partial E}{\partial c_1} = \sum_{t=1}^{N} 2(Q_t - V_t)s_{1t} = 0$$

$$\frac{\partial E}{\partial c_2} = \sum_{t=1}^{N} 2(Q_t - V_t)s_{2t} = 0$$

$$\frac{\partial E}{\partial c_3} = \sum_{t=1}^{N} 2(Q_t - V_t)s_{3t} = 0$$

$$\frac{\partial E}{\partial c_4} = \sum_{t=1}^{N} 2(Q_t - V_t)s_{1t}s_{2t} = 0$$

$$\frac{\partial E}{\partial c_5} = \sum_{t=1}^{N} 2(Q_t - V_t)s_{2t}s_{3t} = 0$$

$$\frac{\partial E}{\partial c_6} = \sum_{t=1}^{N} 2(Q_t - V_t)s_{1t}s_{3t} = 0$$

$$\frac{\partial E}{\partial c_7} = \sum_{t=1}^{N} 2(Q_t - V_t)s_{1t}s_{2t}s_{3t} = 0$$

$$\frac{\partial E}{\partial c_8} = \sum_{t=1}^{N} 2(Q_t - V_t) = 0.$$

The model coefficients $c_1, c_2, \ldots, c_8$ may then be determined iteratively using appropriate initial values for the model coefficients.

Similar operations may be performed by model generation logic 130, EMC 113 and/or CZMC 118 to generate a model, i.e., determine model parameters, for cooling zone configurations with more than three or fewer than three fans zones. The operations may be repeated to generate respective model(s) for other cooling zone configurations. A respective model (i.e., model coefficients) for each cooling zone configuration may then be associated with a cooling zone configuration ID and stored in model store 142. Thus, model(s) may be generated a priori for each possible cooling zone configuration.

In an embodiment, each model may be associated with a respective one cooling zone configuration and, thus, a respective one cooling zone configuration ID. In another embodiment, each model may be associated with one or more cooling zone configurations. For example, one or more model coefficients may be relatively more sensitive to a subset of cooling zone configuration parameters. In other words, fewer than all of the cooling zone configuration parameters may affect model coefficients. Thus, an appropriate model may be selected based, at least in part, on a subset of configuration data.

During operation, PTAS logic 132 is configured to manage data acquisition and determination of volumetric airflow, Q, and cooling zone outlet temperature, Toutlet. Volumetric airflow may be modeled based, at least in part, on cooling zone configuration, as described herein. A cooling zone configuration may be changed by a user after initial provisioning. Changes to a cooling zone configuration, e.g., components and/or rack elements included in the cooling zone and/or physical configuration of the rack elements in the cooling zone, may affect volumetric airflow. For example, a rack element that includes storage component(s) may be replaced with a rack element that includes compute component(s). The compute component(s) may produce relatively more heat than the storage component(s) and/or the respective physical configurations of the computer component(s) and storage component(s) in the rack element may also differ. In another example, a first sled may be replaced by a second sled and the second sled may be associated with one or more model parameter(s) that are different from one or more model parameter(s) associated with the first sled. The volumetric airflow for the cooling zone that includes the rack element may thus be affected by the change. Thus, a cooling zone configuration may be changed dynamically, by a user, after initial provisioning of a rack that includes the cooling zone. Changes to cooling zone configuration may then result in a change in impedance and a related change in the relationship between fan speed(s) and volumetric airflow.

During operation, PTAS logic 132 is configured to detect changes in cooling zone configuration. For example, PTAS logic 132 may be configured to identify a current cooling zone configuration of a target cooling zone, e.g., cooling zone 104a, prior to determining volumetric airflow and/or Toutlet for the target cooling zone. PTAS logic 132 may identify the cooling zone configuration based at least in part on acquired cooling zone configuration data. For example, the cooling zone configuration data may be requested from, for example, a management controller related to the cooling zone, e.g., one or more of EMC 113, CZMC 118, rack management logic 128. In another example, the cooling zone configuration data may be determined directly by the PTAS logic 132.

The cooling zone configuration may then be identified based, at least in part, on the cooling zone configuration data stored in configuration data store 140. In an embodiment, the PTAS logic 132 may be configured to look up a corresponding configuration ID in configuration data store 140. The PTAS logic 132 may be configured to form the acquired current cooling zone configuration data into a current configuration vector, as described herein. The current configuration vector may then be compared to stored vectors of configuration parameters in configuration data store 140 to identify a corresponding stored vector of configuration parameters. An associated configuration ID 144 may then be retrieved and used as an index into model store 142. Such a look up technique may be performed when all or nearly all cooling zone configurations have been modeled a priori, as described herein.

In another embodiment, PTAS logic 132 may be configured to identify a cooling zone configuration based, at least in part, on a subset of the acquired cooling zone configuration data. For example, selection of cooling zone configuration parameters included in the subset may be related to sensitivity of one or more model coefficients to the selected cooling zone configuration parameters. In another example, cooling zone configuration parameters may be selected that have corresponding values in one or more stored configuration vectors, i.e., a subset of vector elements. The subset may be used to determine a "best match" cooling zone configuration ID. The determined cooling zone ID may then be utilized as an index into model store 142. Such a technique may be utilized when fewer than all possible cooling zone configurations have been modeled a priori, as described herein.

After the cooling zone configuration is identified, a cooling zone configuration ID 144 associated with the identified configuration data set may then be retrieved. For example, PTAS logic 132 may be configured to determine the index. The cooling zone configuration ID 144 may then be utilized as an index into the model store 142 to select an associated model (i.e., set of model parameters). The selected model may then correspond to the identified cooling zone configuration.

The fan speed(s) of fan(s) associated with the target cooling zone 104a may then be acquired. For example, the fan speed(s) may be captured by CZMC 118. The fan speed(s) may be captured at a rate that corresponds to a sample interval. For example, a duration of the sample interval may be one second.

Local thermal management operations for each cooling zone, e.g., cooling zone 104a, may be performed by, e.g., CZMC 118. CZMC 118 may be configured to receive current cooling zone 104a temperature information from one or more temperature sensor(s), e.g., TS 112. CZMC 118 may be further configured to adjust a duty cycle of a PWM input signal to fan(s) in one or more fan zone(s), e.g., fan zone 114a, based, at least in part, on the sensed temperature(s). PTAS operations, as described herein, may be performed independent of local thermal management operations.

After the cooling zone configuration is identified, target cooling zone 104a volumetric airflow may be determined based, at least in part, on the captured fan speed(s) and based, at least in part, on the selected model. For example, for a fan zone that includes a plurality of fans, an average fan speed of the fans included in the fan zone may be used in the volumetric airflow determination. In another example, a maximum fan speed of the fans included in the fan zone may be used.

In an embodiment, the model parameters may include a constant term configured to represent power supply region airflow when power supply fan speed is not measured. In another embodiment, the model parameters may include a coefficient (i.e., weight) related to the power supply fan. In this embodiment, power supply fan speed may be captured and the volumetric airflow may be determined based, at least in part, on the power supply fan speed and the power supply fan speed coefficient.

Thus, volumetric airflow may be determined based, at least in part, on an identified cooling zone configuration and based, at least in part, on detected fan speed(s). Toutlet may then be determined based, at least in part, on the volumetric airflow, as described herein.

Toutlet is related to cooling zone inlet temperature, volumetric airflow and power consumption of components contained in the cooling zone as $$Toutlet = Tinlet + 1.76 * P * Kalt / Q,$$

where Toutlet is cooling zone outlet airflow temperature in degrees Celsius (C), Tinlet is cooling zone inlet temperature of the cooling zone in degrees C., 1.76 is a conversion factor, P is power consumption of components contained in the cooling zone in Watts, Kalt is an air density correction factor related to altitude and Q is volumetric airflow in cubic feet per minute (CFM) produced by fan(s) configured to move air through the cooling zone.

A value for Kalt may be selected based, at least in part, on altitude. Kalt may be supplied by a user and may be based, at least in part, on an altitude relative to sea level. Kalt corresponds to a ratio of air density at sea level to air density at a cooling zone altitude. For example, the cooling zone altitude may correspond to the data center altitude. Kalt is thus configured to account for variation in air density related to altitude. Kalt is related to mass of air associated with volumetric airflow Q since heat transfer is associated with mass rather than volumetric airflow. Kalt may be relatively smaller at higher altitudes and relatively larger at lower altitudes. The conversion factor is configured to account for specific heat of air (Cp=1005 J/(kg–K)), air density at sea level ($\rho_{sea}$=1.205 kg/m$^3$) and unit conversion of airflow from units of m$^3$/s to CFM where J is Joules, kg is kilograms, K is degrees Kelvin, m is meters and s is seconds. The relationship for Toutlet, Tinlet, Q, P and Kalt may be derived from:

$$\dot{m} C_p (T_{outlet} - T_{inlet}) = P$$

where $\dot{m}$ is mass airflow (=$\rho_{alt} Q$), $\rho_{alt}$ is air density at cooling zone altitude and $C_p$, Toutlet, Tinlet and P are as described herein.

Each cooling zone, e.g., cooling zone 104a, may include one or more temperature sensors, e.g., TS 112. One or more of the temperature sensor(s) may generally be positioned at or near an inlet to the rack that contains the cooling zones. For example, in a data center with racks arranged in rows, the inlet may correspond to an area between adjacent rows where cooled air from the data center facility is provided to the racks. A temperature sensed by TS 112 may correspond to Tinlet. For example, the sensed temperature may be acquired by PTAS logic 132 from CZMC 118 and/or EMC 113. For cooling zones that include a plurality of temperature sensors, the inlet temperature may be determined based, at least in part, on one or more of the sensed temperatures. For example, Tinlet may correspond to an average of two or more of the sensed temperatures. In another example, Tinlet may correspond to a selected sensed temperature, e.g., maximum sensed temperature or minimum sensed temperature. In these embodiments, PTAS logic 132 may be configured to determine Tinlet.

Each cooling zone, e.g., cooling zone 104a, contains one or more component(s) 111a, 111b, . . . , 111n that may produce heat related to their operations. An amount of heat produced is related to power consumption of the component(s) 111a, 111b, . . . , 111n. For example, power consumption may typically be monitored for each rack element by an associated EMC, e.g., EMC 113 for rack element 110a. In another example, power consumption may be monitored by one or more EMC(s) and/or CZMC 118. CZMC 118 may be configured to aggregate power consumption by the rack element(s) 110a, 110b, . . . , 110n to generate a power consumption for the cooling zone, e.g., cooling zone 104a. Power consumption associated with the cooling zone 104a may then be acquired by PTAS logic 132 from, for example, CZMC 118.

Generally, power consumption varies over time. The heat produced by heat producing components varies with power consumption, thus, heat production also varies with time. A cooling zone temperature related to a change in power consumption of (and heat produced by) components included in the cooling zone may not change instantaneously. The temperature change may be related to the power consumption change by a thermal time constant, t, of the cooling zone. The thermal time constant may be on the order of hundreds to thousands of seconds. For example, the thermal time constant may be in the range of 200 to 500 seconds.

For example, power consumed by a compute element may be related to a state of a processor (e.g., active or standby), processor workload (current and/or recent), current and/or recent operations executed by the processor, etc. Measured power consumption may include measurement errors and/or time-based measurement variation. In order to account for measurement errors and/or measurement variation, power consumption values may be captured over time and a resulting power consumption value may be determined based, at least in part, on the captured power consumption values. The power consumption values may be captured at time intervals (i.e., sampling period, $\Delta t$). The power consumption sampling period may be on the order of tens or hundreds of seconds. For example, the power consumption sampling period may be 100 seconds.

For example, a resulting power consumption value may be determined as an exponential moving average (EMA) of the captured (i.e., measured) power consumption values. Generally, an EMA applies weighting factors to each value of a series of values. The weighting factors are configured to decrease exponentially so that weight depends on position in the series. An amount of decrease is related to a decay coefficient $\alpha$, where $\alpha$ is between zero and one. Values of a relatively closer to one correspond to a relatively faster decrease in weighting factors and a relatively larger contribution to the resulting power consumption EMA from relatively more recently acquired power consumption values (i.e., a relatively smaller contribution from relatively older acquired power consumption values). $\alpha$ may be related to sampling period, $\Delta t$, and cooling zone thermal time constant, $\tau$, as $\alpha = 1 - (\Delta t / \tau)$.

A power consumption EMA ($P\_EMA_t$) may be determined recursively as:

$$P\_EMA_t = \alpha P_t + (1-\alpha) * P\_EMA_{t-1}$$

where t=1, 2, 3, . . . , t is an index that corresponds to an acquired power consumption value in a series of acquired power consumption values, $P\_EMA_t$ is the current power consumption EMA, $P_t$ corresponds to a current acquired power consumption value and $P\_EMA_{t-1}$ is a prior power consumption EMA. The index t may be related to a time interval (i.e., sample interval) between acquisitions of a first power consumption value and a second, subsequent power consumption value. $P\_EMA_t$ may be expanded as:

$$P\_EMA_t = \alpha[P_t + (1-\alpha)P_{t-1} + (1-\alpha)^2 P_{t-3} + \ldots + (1-\alpha)^k P_{t-k}] + (1-\alpha)^{(k+1)} P\_EMA_{t-k}$$

for appropriate k=1, 2, 3, . . . . It may be appreciated that the weighting factor for each captured power consumption $P_{t-i}$ has the general form $\alpha(1-\alpha)^i$, i=0, 1, 2, . . . . Thus, the EMA power consumption for a cooling zone, e.g., cooling zone 104a, may be determined based, at least in part, on a plurality of acquired power consumption values. The power consumption EMA is configured to account for variation in power consumption over time by weighting relatively more recent power consumption values relatively higher than relatively less recent power consumption values.

The outlet air temperature (Toutlet) of the target cooling zone 104a may then be determined based, at least in part, on volumetric airflow and based, at least in part, on a determined power consumption term. For example, PTAS logic 132 may be configured to determine the volumetric airflow and Toutlet. The volumetric airflow is related to fan zone fan speed(s) and cooling zone configuration, as described herein. The power consumption term is related to acquired power consumption values that are weighted using an exponential moving average, as described herein. Thus, dynamic changes to cooling zone configurations may be accommodated and relatively accurate telemetry of volumetric airflow and Toutlet may be provided to the data center management system.

RMC 102 may be configured to expose a volumetric airflow sensor configured to sense Q and a Toutlet sensor configured to sense Toutlet to the data center management system via an API, e.g., a rack scale architecture (RSA) management API. Thus, the data center management system may access the sensor data via a consistent interface.

Figure 2A:
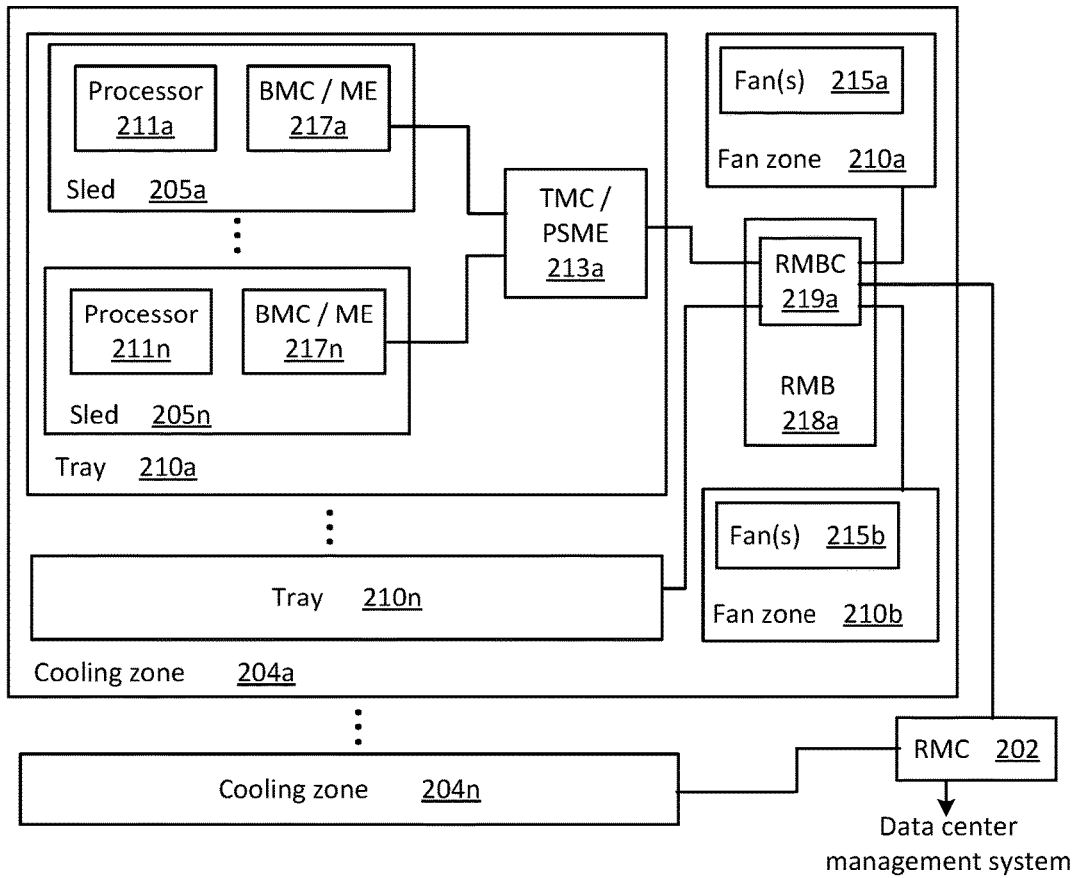
FIG. 2A illustrates one example power thermal awareness system at initial provisioning, consistent with one embodiment of the present disclosure.

FIG. 2A illustrates one example power thermal awareness system 200 at initial provisioning, consistent with one embodiment of the present disclosure. Example system 200 includes a rack management controller (RMC) 202 and a plurality of cooling zones 204a, . . . , 204n. Each cooling zone, e.g., cooling zone 204a, includes a plurality of trays (i.e., drawers) 210a, . . . , 210n and two fan zones 214a, 214b. Each fan zone 214a, 214b includes one or more fan(s) 215a, 215b, respectively. Each cooling zone, e.g., cooling zone 204a, further includes a respective rack management backplane (RMB), e.g., RMB 218a. Each RMB, e.g., RMB 218a, includes a respective rack management backplane controller (RMBC) 219a. Each tray, e.g., tray 210a, includes a plurality of sleds 205a, . . . , 205n and a tray management controller and/or pooled system management engine (TMC/PSME) 213a. Each sled 205a, . . . , 205n includes a respective processor 211a, . . . , 211n and a respective baseboard management controller and/or management engine (BMC/ME) 217a, . . . , 217n.

Each sled 205a, . . . , 205n is coupled to TMC/PSME 213a by a respective BMC/ME 217a, . . . , 217n. Each tray, e.g., tray 210a, is coupled to RMBC 219a by a respective TMC/PSME, e.g., TMC/PSME 213a. Each RMB, e.g., RMB 218a is coupled to RMC 202 by a respective RMBC, e.g., RMBC 219a. Thus, cooling zones 204a, . . . , 204n are coupled to RMC 202. RMC 202 is coupled to a data center management system.

Cooling zone 204a illustrates the cooling zone configuration at initial provisioning of example system 200. RMC 202 is configured to store models, determined a priori as described herein, that correspond to possible configurations of cooling zone 104a. During operation, RMC 202 is configured to acquire configuration data related to cooling zone 104a, compare the acquired configuration data to stored configuration data, identify the configuration and select a first model based, at least in part, on a first configuration ID, as described herein. RMC 202 is further configured to acquire fan speed(s) of fan(s) 215a and 215b, acquire Tinlet and acquire and/or determine power consumption of trays 210a, . . . , 210n, as described herein. RMC 202 may then determine volumetric airflow Q and/or Toutlet for cooling zone 204a, as described herein, and provide the volumetric airflow and Toutlet to data center management system. RMC 202 may perform similar operations for each other cooling zone, e.g., cooling zone 204n, included in example system 200.

Figure 2B:
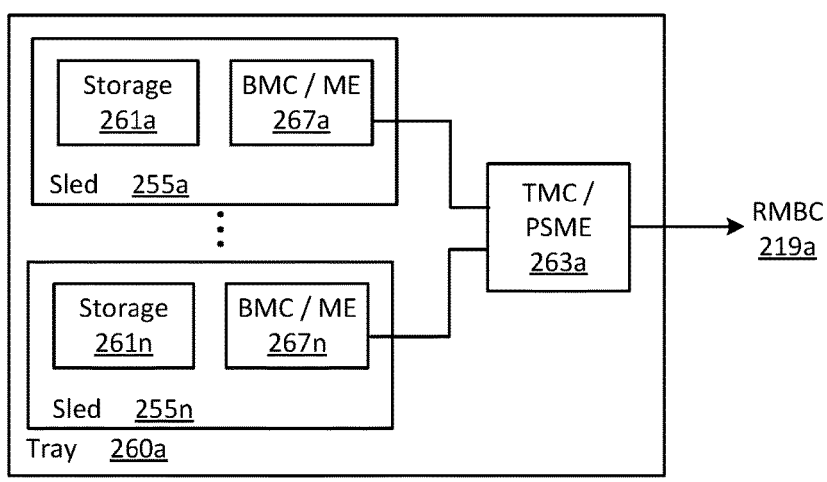
FIG. 2B illustrates a portion of the example of FIG. 2A after a dynamic reconfiguration of at least one cooling zone, consistent with one embodiment of the present disclosure.

FIG. 2B illustrates a portion 250 of the example system of FIG. 2A after a dynamic reconfiguration of at least one cooling zone, consistent with one embodiment of the present disclosure. FIG. 2B may be best understood when viewed together with FIG. 2A. Portion 250 includes tray 260a. The dynamic reconfiguration replaced tray 210a in cooling zone 204a with tray 260a. Thus, the model that corresponded to initially provisioned cooling zone 204a that included tray 210a may not correspond to a reconfigured cooling zone 204a that includes tray 260a.

Tray 260a includes a plurality of sleds 255a, ..., 255n and a tray management controller and/or pooled system management engine TMC/PSME 263a. Each sled 255a, ..., 255n includes a respective storage component 261a, ..., 261n and a respective baseboard management controller and/or management engine (BMC/ME) 267a, ..., 267n. Each sled 255a, ..., 255n is coupled to TMC/PSME 263a by a respective BMC/ME 267a, ..., 267n. Tray 260a, is coupled to RMBC 219a by TMC/PSME 213a.

In operation, RMC 202 may acquire configuration data related to cooling zone 204a that includes tray 260a, compare the acquired configuration data to stored configuration data, identify the configuration and select a second model based, at least in part, on a second configuration ID, as described herein. The second model may then correspond to cooling zone 204a with tray 210a replaced by tray 260a. For example, storage components 261a, ..., 261n may have a form factor that differs from a form factor of processors 211a, ..., 211n. The difference in form factors may affect the impedance of cooling zone 204a and, thus a relationship between fan speed(s) and resulting volumetric airflow. RMC 202 is configured to acquire fan speed(s) of fan(s) 215a and 215b. RMC 202 may then determine volumetric airflow Q for cooling zone 204a that includes tray 260a using the second model, as described herein. RMC 202 may determine Toutlet and provide the volumetric airflow and Toutlet to data center management system, as described herein. Thus, the dynamic reconfiguration of cooling zone 204a may be detected and accommodated. An accuracy of a determined volumetric airflow may then be preserved.

Figure 3:
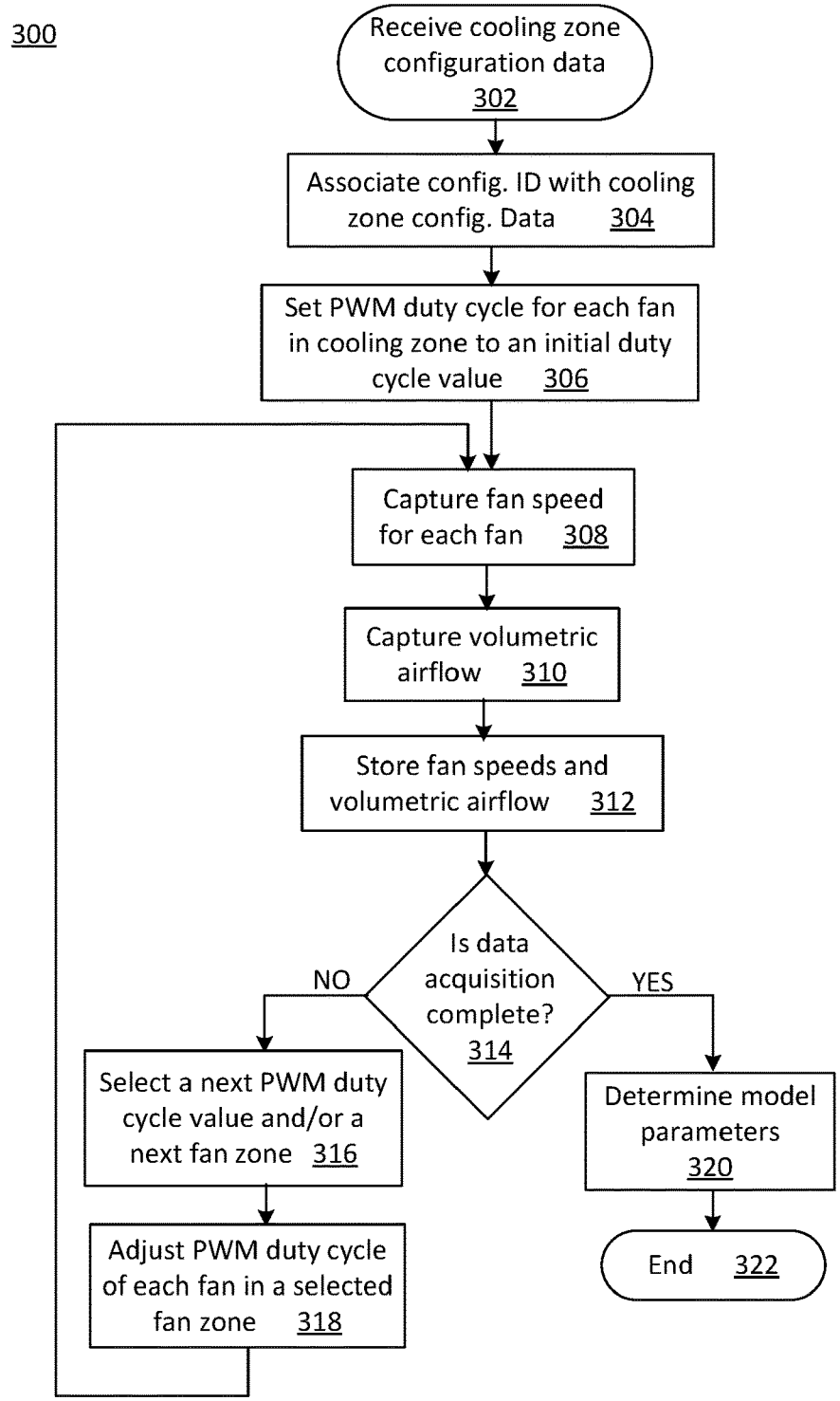
FIG. 3 is a flowchart of cooling zone model generation operations according to various embodiments of the present disclosure.

FIG. 3 is a flowchart 300 of cooling zone model generation operations according to various embodiments of the present disclosure. In particular, the flowchart 300 illustrates generating a model (i.e., model parameters that correspond to fan speed coefficients). The operations may be performed, for example, by the RMC 102 and/or model generation logic 113 of FIG. 1.

Operations of this embodiment may begin with receiving cooling zone configuration data 302. For example, the cooling zone configuration data may be received from a user via a user interface and/or from one or more management controllers. Operation 304 includes associating a configuration ID with the cooling zone configuration data. A PWM duty cycle for each fan in a cooling zone may be set to an initial duty cycle value at operation 306. A PWM duty cycle for fans included in one fan zone may be the same. A fan speed for each fan in the cooling zone may be captured at operation 308. A volumetric airflow may be captured at operation 310. For example, the volumetric airflow may be captured from a wind tunnel. Operation 312 includes storing fan speeds and volumetric airflow.

Whether data acquisition is complete may be determined at operation 314. Data acquisition is configured to capture fan speed(s) and volumetric airflow for each combination of PWM duty cycle and fan zone, as described herein. Thus, data acquisition may be complete when all combinations (i.e., $v^n$ combinations) of PWM duty cycle value and fan zone have been implemented. If data acquisition is not complete, a next PWM duty cycle value and/or a next fan zone may be selected at operation 316. The PWM duty cycle of each fan in a selected fan zone may be adjusted at operation 318. Program flow may then proceed to operation 308. If data acquisition is complete, model parameters may be determined at operation 320. For example, model parameters may be determined using a regression and minimizing a sum of squared errors. For example, the regression may be a three-level regression. In an embodiment, determining model parameters may include sensitivity analysis relating model parameters to selected cooling zone configuration parameter(s). Program flow may then end at operation 322.

Thus, model parameters, i.e., fan speed coefficients, may be determined based, at least in part, on cooling zone configuration data. The model is configured to relate fan speed(s) and cooling zone configuration to volumetric airflow. Impedance of the cooling zone is related to cooling zone configuration. A plurality of models, i.e., sets of model parameters, may thus be determined a priori.

Figure 4:
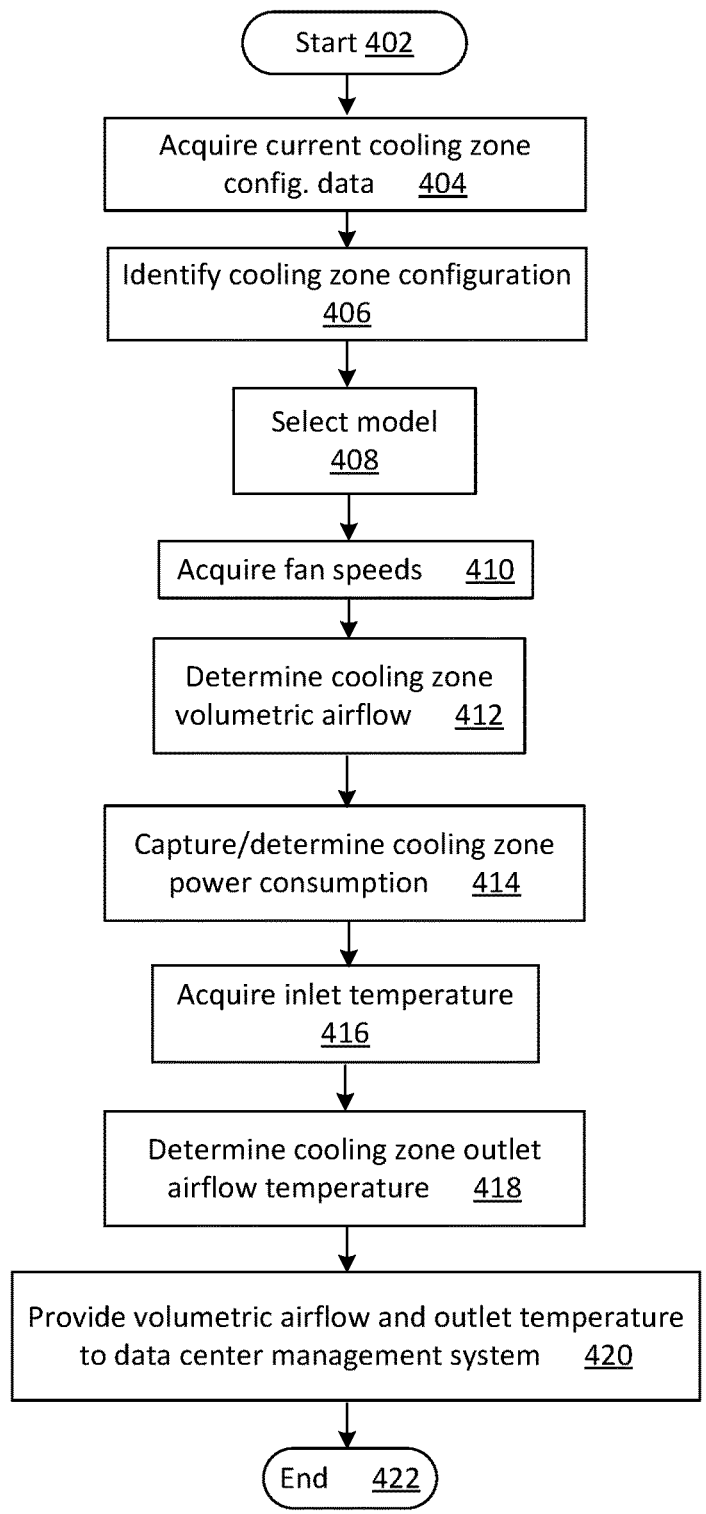
FIG. 4 is a flowchart of cooling zone outlet temperature determination operations according to various embodiments of the present disclosure.

FIG. 4 is a flowchart 400 of cooling zone outlet temperature determination operations according to various embodiments of the present disclosure. In particular, flowchart 400 illustrates identifying the cooling zone configuration, selecting an appropriate model based, at least in part, on the configuration ID and determining cooling zone volumetric airflow based, at least in part, on the selected model and based, at least in part, on acquired fan speeds. The operations may be performed, for example, by the RMC 102 and/or PTAS logic 132 of FIG. 1.

Operations of this embodiment may begin with start 402. Operation 404 includes acquiring current cooling zone configuration data. For example, the cooling zone data may be acquired from one or more management controller(s). A cooling zone configuration may be identified at operation 406. For example, the cooling zone configuration may be identified by comparing acquired cooling zone data with a plurality of stored sets of configuration data. A model may be selected at operation 408. For example the model may be selected from one or more models based, at least in part, on the cooling zone configuration ID. Each model corresponds to a respective set of model parameters. Fan speeds may be acquired at operation 410. For example, fan speeds may be acquired for one or more fans included in each fan zone. Cooling zone volumetric airflow may be determined at operation 412. For example, cooling zone volumetric airflow may be determined based, at least in part, on the identified cooling zone configuration and based, at least in part, on acquired fans speeds.

Operation 414 includes capturing and/or determining a cooling zone power consumption. For example, the cooling zone power consumption may be determined using an exponential moving average of a series of captured power consumption values. Inlet temperature may be acquired at operation 416. A cooling zone outlet airflow temperature may be determined at operation 418. Volumetric airflow and outlet temperature may be provided to a data center management system at operation 420. Program flow may end at operation 422.

Thus, changes to a cooling zone after initial provisioning of rack elements may be accommodated. A current cooling zone configuration may be identified and an associated model selected based, at least in part, on the configuration ID. A volumetric airflow determined based, at least in part, on the associated model may then correspond to the current cooling zone configuration. Volumetric airflow and an associated Toutlet may then be provided to the data center management system, e.g., via an API. Efficient cooling may thus be facilitated.

While the flowcharts of FIGS. 3 and 4 illustrate operations according various embodiments, it is to be understood that not all of the operations depicted in FIGS. 3 and/or 4 are necessary for other embodiments. In addition, it is fully contemplated herein that in other embodiments of the present disclosure, the operations depicted in FIGS. 3 and/or 4, and/or other operations described herein may be combined in a manner not specifically shown in any of the drawings, and such embodiments may include less or more operations than are illustrated in FIGS. 3 and/or 4. Thus, claims directed to features and/or operations that are not exactly shown in one drawing are deemed within the scope and content of the present disclosure.

Memory 124 may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hard-wired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

Communication logic 122, EMC 113, CZMC 118 and/or RMC 102 of FIG. 1 and/or BMC/ME 217a, . . . , 218n, 267a, . . . , 267n, TMC/PSME 213a, 263a, RMBC 219a and/or RMC 202 of FIG. 2 may be configured to comply or be compatible with a platform management interface specification. For example, the platform management interface specification may comply or be compatible with the Intelligent Platform Management Interface Specification, Second Generation, version 2.0, revision 1.0, published February 2004, later versions and/or revisions of this specification, e.g., version 2.0, revision 1.1 released October 2013, and/or related specification(s).

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

Thus, consistent with the teachings of the present disclosure, a power thermal awareness solution (PTAS) is configured to determine a volumetric airflow for a cooling zone. A plurality of models may be generated a priori (i.e., prior to initial provisioning of rack elements). Each model is configured to relate cooling fan speed(s) and respective cooling zone configuration to volumetric airflow for the respective cooling zone. The plurality of models is configured to accommodate changes to cooling zone configuration(s) that may occur after initial provisioning, as described herein. An appropriate model may then be selected during operation based, at least in part, on a configuration of a target cooling zone. The volumetric airflow may be determined based, at least in part, on the selected model. The PTAS is further configured to determine an outlet airflow temperature for the cooling zone based, at least in part, on the determined volumetric airflow.

EXAMPLES

Examples of the present disclosure include subject material such as a method, means for performing acts of the method, a device, or of an apparatus or system related to a power thermal awareness solution, as discussed below.

Example 1

According to this example there is provided an apparatus system. The apparatus includes power thermal awareness solution (PTAS) logic. The PTAS logic is to select a model from a plurality of models based, at least in part, on a configuration of a cooling zone; and determine a cooling zone volumetric airflow based, at least in part, on the selected model.

Example 2

This example includes the elements of example 1, wherein the PTAS logic is further to identify the configuration of the cooling zone.

Example 3

This example includes the elements of example 1, wherein the PTAS logic is further to determine a cooling zone outlet temperature based, at least in part, on the volumetric airflow.

Example 4

This example includes the elements according to any one of examples 1 through 3, and further includes model generation logic to generate the plurality of models, each model associated with at least one cooling zone configuration.

Example 5

This example includes the elements according to any one of examples 1 through 3, wherein the volumetric airflow is determined based, at least in part, on at least one fan speed and based, at least in part, on the configuration of the cooling zone.

Example 6

This example includes the elements according to any one of examples 1 through 3, wherein the PTAS logic is further to determine a power consumption associated with the cooling zone.

Example 7

This example includes the elements according to any one of examples 1 through 3, wherein the PTAS logic is to acquire a respective fan speed for each fan associated with the cooling zone.

Example 8

This example includes the elements according to any one of examples 1 through 3, wherein the selected model relates at least one fan speed and the configuration of the cooling zone.

Example 9

This example includes the elements of example 6, wherein the power consumption is related to an exponential moving average of a series of measured power consumption values.

Example 10

This example includes the elements according to any one of examples 1 through 3, wherein the volumetric airflow is determined based, at least in part, on the selected model.

Example 11

This example includes the elements of example 3, wherein the outlet temperature is determined based, at least in part, on the volumetric airflow.

Example 12

This example includes the elements according to any one of examples 1 through 3, and further includes a configuration data store to store the plurality of models.

Example 13

This example includes the elements of example 12, wherein each stored model is associated with a configuration identifier (ID).

Example 14

This example includes the elements according to any one of examples 1 through 3, wherein the PTAS logic is further to acquire cooling zone configuration data.

Example 15

This example includes the elements according to any one of examples 1 through 3, wherein the PTAS logic is further to provide the cooling zone volumetric airflow to a data center management system.

Example 16

This example includes the elements of example 3, wherein the PTAS logic is further to provide the cooling zone outlet temperature to a data center management system.

Example 17

This example includes the elements according to any one of examples 1 through 3, wherein the configuration of the cooling zone is different from an initially provisioned configuration of the cooling zone.

Example 18

This example includes the elements of example 4, wherein the model generation logic is to receive cooling zone configuration data, set a pulse width modulation (PWM) duty cycle, capture a fan speed of each fan included in the cooling zone, capture a volumetric airflow from a wind tunnel and store each captured fan speed and the captured volumetric airflow.

Example 19

This example includes the elements of example 18, wherein the PWM duty cycle is greater than or equal to 25 percent.

Example 20

This example includes the elements according to any one of examples 1 through 3, wherein the selected model comprises at least one model coefficient to multiply a fan speed and an independent term related to a power supply fan.

Example 21

This example includes the elements of example 20, wherein the fan speed corresponds to a maximum fan speed of a plurality of fan speeds.

Example 22

This example includes the elements of example 18, wherein the model generation logic is to repeat setting, capturing the fan speed, capturing the volumetric airflow and storing for each of a number of PWM duty cycle values.

Example 23

This example includes the elements of example 22, wherein the number of PWM duty cycle values is related to a number of fan zones included in the cooling zone.

Example 24

This example includes the elements according to any one of examples 1 through 3, wherein at least one of the plurality of models is related to a plurality of cooling zone configurations.

Example 25

According to this example there is provided a method. The method includes selecting, by a power thermal awareness solution (PTAS) logic, a model from a plurality of models based, at least in part, on configuration of a cooling zone; and determining, by the PTAS logic, a cooling zone volumetric airflow based, at least in part, on the selected model.

Example 26

This example includes the elements of example 25, and further includes identifying, by the PTAS logic, the configuration of the cooling zone.

Example 27

This example includes the elements of example 25, and further includes determining, by the PTAS logic, a cooling zone outlet temperature based, at least in part, on the volumetric airflow.

Example 28

This example includes the elements of example 25, and further includes generating, by model generation logic, the plurality of models, each model associated with at least one cooling zone configuration.

Example 29

This example includes the elements of example 25, wherein the selected model relates at least one fan speed and the configuration of the cooling zone.

Example 30

This example includes the elements of example 25, and further includes determining, by the PTAS logic, a power consumption associated with the cooling zone.

Example 31

This example includes the elements of example 30, wherein the power consumption is related to an exponential moving average of a series of measured power consumption values.

Example 32

This example includes the elements of example 25, and further includes acquiring, by the PTAS logic, a respective fan speed for each fan associated with the cooling zone

Example 33

This example includes the elements of example 25, wherein the volumetric airflow is determined based, at least in part, on at least one fan speed and based, at least in part, on the configuration of the cooling zone.

Example 34

This example includes the elements of example 25, wherein the volumetric airflow is determined based, at least in part, on the selected model.

Example 35

This example includes the elements of example 27, wherein the outlet temperature is determined based, at least in part, on the volumetric airflow.

Example 36

This example includes the elements of example 25, and further includes acquiring, by the PTAS logic, cooling zone configuration data.

Example 37

This example includes the elements of example 25, and further includes providing, by the PTAS logic, the cooling zone volumetric airflow to a data center management system.

Example 38

This example includes the elements of example 27, and further includes providing, by the PTAS logic, the cooling zone outlet temperature to a data center management system.

Example 39

This example includes the elements of example 25, wherein the configuration of the cooling zone is different from an initially provisioned configuration of the cooling zone.

Example 40

This example includes the elements of example 25, wherein the cooling zone comprises a fan contained in a rack that includes the cooling zone.

Example 41

This example includes the elements of example 28, and further includes: receiving, by the model generation logic, cooling zone configuration data; setting, by the model generation logic, a pulse width modulation (PWM) duty cycle; capturing, by the model generation logic, a fan speed of each fan included in the cooling zone; capturing, by the model generation logic, a volumetric airflow from a wind tunnel; and storing, by the model generation logic, each captured fan speed and the captured volumetric airflow.

Example 42

This example includes the elements of example 41, wherein the PWM duty cycle is greater than or equal to 25 percent.

Example 43

This example includes the elements of example 25, wherein the selected model includes at least one model coefficient to multiply a fan speed and an independent term related to a power supply fan.

Example 44

This example includes the elements of example 43, wherein the fan speed corresponds to a maximum fan speed of a plurality of fan speeds.

Example 45

This example includes the elements of example 41, and further includes: repeating, by the model generation logic, setting, capturing the fan speed, capturing the volumetric airflow and storing for each of a number of PWM duty cycle values.

Example 46

This example includes the elements of example 45, wherein the number of PWM duty cycle values is related to a number of fan zones included in the cooling zone.

Example 47

This example includes the elements of example 25, wherein at least one of the plurality of models is related to a plurality of cooling zone configurations.

Example 48

According to this example there is provided a system. The system includes a cooling zone and a rack management controller (RMC). The cooling zone includes at least one rack element and a fan zone including at least one fan. The RMC includes power thermal awareness solution (PTAS) logic. The PTAS logic is to select a model from a plurality of models based, at least in part, on a configuration of the cooling zone, and determine a cooling zone volumetric airflow based, at least in part, on the selected model.

Example 49

This example includes the elements of example 48, wherein the PTAS logic is further to identify the configuration of the cooling zone.

Example 50

This example includes the elements of example 48, wherein the PTAS logic is further to determine a cooling zone outlet temperature based, at least in part, on the volumetric airflow.

Example 51

This example includes the elements of example 48, wherein the RMC further includes model generation logic to generate the plurality of models, each model associated with at least one cooling zone configuration.

Example 52

This example includes the elements of example 48, wherein the selected model relates at least one fan speed and the configuration of the cooling zone.

Example 53

This example includes the elements according to any one of examples 48 through 52, wherein the volumetric airflow is determined based, at least in part, on at least one fan speed and based, at least in part, on the configuration of the cooling zone.

Example 54

This example includes the elements according to any one of examples 48 through 52, wherein the PTAS logic is further to determine a power consumption associated with the cooling zone.

Example 55

This example includes the elements according to any one of examples 48 through 52, wherein the PTAS logic is to acquire a respective fan speed for each fan associated with the cooling zone.

Example 56

This example includes the elements according to any one of examples 48 through 52, wherein the at least one rack element comprises one or more of a compute component, a storage component, a networking component and a memory component.

Example 57

This example includes the elements according to any one of examples 48 through 52, wherein the selected model is related to a number of fan zones.

Example 58

This example includes the elements of example 54, wherein the power consumption is related to an exponential moving average of a series of measured power consumption values.

Example 59

This example includes the elements according to any one of examples 48 through 52, wherein the volumetric airflow is determined based, at least in part, on the selected model.

Example 60

This example includes the elements of example 50, wherein the outlet temperature is determined based, at least in part, on the volumetric airflow.

Example 61

This example includes the elements according to any one of examples 48 through 52, wherein the RMC includes a configuration data store to store the plurality of models.

Example 62

This example includes the elements of example 61, wherein each stored model is associated with a configuration identifier (ID).

Example 63

This example includes the elements according to any one of examples 48 through 52, wherein the cooling zone further includes at least one management controller.

Example 64

This example includes the elements of example 63, wherein at least one of the at least one management controller is to acquire an inlet temperature associated with the cooling zone.

Example 65

This example includes the elements according to any one of examples 48 through 52, wherein a number of fans is equal to a number of fan zones.

Example 66

This example includes the elements according to any one of examples 48 through 52, wherein a number of fans is greater than a number of fan zones.

Example 67

This example includes the elements according to any one of examples 48 through 52, wherein the cooling zone comprises one fan zone.

Example 68

This example includes the elements according to any one of examples 48 through 52, wherein the cooling zone comprises a plurality of fan zones.

Example 69

This example includes the elements of example 48, wherein each fan in the fan zone is to receive a pulse width modulated (PWM) input signal with a same PWM duty cycle.

Example 70

This example includes the elements according to any one of examples 48 through 52, wherein the PTAS logic is further to acquire cooling zone configuration data.

Example 71

The system according to any one of examples 48 through 52, wherein the PTAS logic is further to provide the cooling zone volumetric airflow to a data center management system.

Example 72

This example includes the elements of example 50, wherein the PTAS logic is further to provide the cooling zone outlet temperature to a data center management system.

Example 73

This example includes the elements according to any one of examples 48 through 52, wherein the configuration of the cooling zone is different from an initially provisioned configuration of the cooling zone.

Example 74

This example includes the elements according to any one of examples 48 through 52, wherein at least one of the at least one fan is contained in a rack that includes the cooling zone.

Example 75

This example includes the elements of example 51, wherein the model generation logic is to receive cooling zone configuration data, set a pulse width modulation (PWM) duty cycle, capture a fan speed of each fan included in the cooling zone, capture a volumetric airflow from a wind tunnel and store each captured fan speed and the captured volumetric airflow.

Example 76

This example includes the elements of example 75, wherein the PWM duty cycle is greater than or equal to 25 percent.

Example 77

This example includes the elements according to any one of examples 48 through 52, wherein the selected model comprises at least one model coefficient to multiply a fan speed and an independent term related to a power supply fan.

Example 78

This example includes the elements of example 77, wherein the fan speed corresponds to a maximum fan speed of a plurality of fan speeds.

Example 79

This example includes the elements of example 75, wherein the model generation logic is to repeat setting, capturing the fan speed, capturing the volumetric airflow and storing for each of a number of PWM duty cycle values.

Example 80

This example includes the elements of example 79, wherein the number of PWM duty cycle values is related to a number of fan zones included in the cooling zone.

Example 81

This example includes the elements according to any one of examples 48 through 52, wherein at least one of the plurality of models is related to a plurality of cooling zone configurations.

Example 82

According to this example there is provided a device. The device includes a computer readable storage device having stored thereon instructions that when executed by one or more processors result in the following operations including selecting a model from a plurality of models based, at least in part, on configuration of a cooling zone; and determining a cooling zone volumetric airflow based, at least in part, on the selected model.

Example 83

This example includes the elements of example 82, wherein the instructions that when executed by one or more processors results in the following additional operations including: identifying the configuration of the cooling zone.

Example 84

This example includes the elements of example 82, wherein the instructions that when executed by one or more processors results in the following additional operations including: determining a cooling zone outlet temperature based, at least in part, on the volumetric airflow.

Example 85

This example includes the elements of example 82, wherein the instructions that when executed by one or more processors results in the following additional operations including: generating the plurality of models, each model associated with at least one cooling zone configuration.

Example 86

This example includes the elements of example 82, wherein the selected model relates at least one fan speed and the configuration of the cooling zone.

Example 87

This example includes the elements of example 82, wherein the instructions that when executed by one or more processors results in the following additional operations including: determining a power consumption associated with the cooling zone.

Example 88

This example includes the elements of example 87, wherein the power consumption is related to an exponential moving average of a series of measured power consumption values.

Example 89

This example includes the elements according to any one of examples 82 through 87, wherein the instructions that when executed by one or more processors results in the following additional operations including: acquiring a respective fan speed for each fan associated with the cooling zone.

Example 90

This example includes the elements according to any one of examples 82 through 87, wherein the volumetric airflow is determined based, at least in part, on at least one fan speed and based, at least in part, on the configuration of the cooling zone.

Example 91

This example includes the elements according to any one of examples 82 through 87, wherein the volumetric airflow is determined based, at least in part, on the selected model.

Example 92

This example includes the elements of example 84, wherein the outlet temperature is determined based, at least in part, on the volumetric airflow.

Example 93

This example includes the elements according to any one of examples 82 through 87, wherein the instructions that when executed by one or more processors results in the following additional operations including: acquiring cooling zone configuration data.

Example 94

This example includes the elements according to any one of examples 82 through 87, wherein the instructions that when executed by one or more processors results in the following additional operations including: providing the cooling zone volumetric airflow to a data center management system.

Example 95

This example includes the elements of example 84, wherein the instructions that when executed by one or more processors results in the following additional operations including: providing the cooling zone outlet temperature to a data center management system.

Example 96

This example includes the elements according to any one of examples 82 through 87, wherein the configuration of the cooling zone is different from an initially provisioned configuration of the cooling zone.

Example 97

This example includes the elements according to any one of examples 82 through 87, wherein the cooling zone comprises a fan contained in a rack that includes the cooling zone.

Example 98

This example includes the elements of example 85, wherein the instructions that when executed by one or more processors results in the following additional operations including: receiving cooling zone configuration data; setting a pulse width modulation (PWM) duty cycle; capturing a fan speed of each fan included in the cooling zone; capturing a volumetric airflow from a wind tunnel; and storing each captured fan speed and the captured volumetric airflow.

Example 99

This example includes the elements of example 98, wherein the PWM duty cycle is greater than or equal to 25 percent.

Example 100

This example includes the elements according to any one of examples 82 through 87, wherein the selected model includes at least one model coefficient to multiply a fan speed and an independent term related to a power supply fan.

Example 101

This example includes the elements of example 100, wherein the fan speed corresponds to a maximum fan speed of a plurality of fan speeds.

Example 102

This example includes the elements of example 98, wherein the instructions that when executed by one or more processors results in the following additional operations including: repeating setting, capturing the fan speed, capturing the volumetric airflow and storing for each of a number of PWM duty cycle values.

Example 103

This example includes the elements of example 102, wherein the number of PWM duty cycle values is related to a number of fan zones included in the cooling zone.

Example 104

This example includes the elements according to any one of examples 82 through 87, wherein at least one of the plurality of models is related to a plurality of cooling zone configurations.

Example 105

According to this example there is provided a device. The device includes: means for selecting, by a power thermal awareness solution (PTAS) logic, a model from a plurality of models based, at least in part, on configuration of a cooling zone; and means for determining, by the PTAS logic, a cooling zone volumetric airflow based, at least in part, on the selected model.

Example 106

This example includes the elements of example 105, and further includes: means for identifying, by the PTAS logic, the configuration of the cooling zone.

Example 107

This example includes the elements of example 105, and further includes: means for determining, by the PTAS logic, a cooling zone outlet temperature based, at least in part, on the volumetric airflow.

Example 108

This example includes the elements of example 105, and further includes: means for generating, by model generation logic, the plurality of models, each model associated with at least one cooling zone configuration.

Example 109

This example includes the elements of example 105, wherein the selected model relates at least one fan speed and the configuration of the cooling zone.

Example 110

This example includes the elements of example 105, and further includes: means for determining, by the PTAS logic, a power consumption associated with the cooling zone.

Example 111

This example includes the elements of example 110, wherein the power consumption is related to an exponential moving average of a series of measured power consumption values.

Example 112

This example includes the elements according to any one of examples 105 through 110, and further includes: means for acquiring, by the PTAS logic, a respective fan speed for each fan associated with the cooling zone

Example 113

This example includes the elements according to any one of examples 105 through 110, wherein the volumetric airflow is determined based, at least in part, on at least one fan speed and based, at least in part, on the configuration of the cooling zone.

Example 114

This example includes the elements according to any one of examples 105 through 110, wherein the volumetric airflow is determined based, at least in part, on the selected model.

Example 115

This example includes the elements of example 107, wherein the outlet temperature is determined based, at least in part, on the volumetric airflow.

Example 116

This example includes the elements according to any one of examples 105 through 110, and further includes: means for acquiring, by the PTAS logic, cooling zone configuration data.

Example 117

This example includes the elements according to any one of examples 105 through 110, and further includes: means for providing, by the PTAS logic, the cooling zone volumetric airflow to a data center management system.

Example 118

This example includes the elements of example 107, and further includes: means for providing, by the PTAS logic, the cooling zone outlet temperature to a data center management system.

Example 119

This example includes the elements according to any one of examples 105 through 110, wherein the configuration of the cooling zone is different from an initially provisioned configuration of the cooling zone.

Example 120

This example includes the elements according to any one of examples 105 through 110, wherein the cooling zone comprises a fan contained in a rack that includes the cooling zone.

Example 121

This example includes the elements of example 108, and further includes: means for receiving, by the model generation logic, cooling zone configuration data; means for setting, by the model generation logic, a pulse width modulation (PWM) duty cycle; means for capturing, by the model generation logic, a fan speed of each fan included in the cooling zone; means for capturing, by the model generation logic, a volumetric airflow from a wind tunnel; and means for storing, by the model generation logic, each captured fan speed and the captured volumetric airflow.

Example 122

This example includes the elements of example 121, wherein the PWM duty cycle is greater than or equal to 25 percent.

Example 123

This example includes the elements according to any one of examples 105 through 110, wherein the selected model comprises at least one model coefficient to multiply a fan speed and an independent term related to a power supply fan.

Example 124

This example includes the elements of example 123, wherein the fan speed corresponds to a maximum fan speed of a plurality of fan speeds.

Example 125

This example includes the elements of example 121, and further includes: means for repeating, by the model generation logic, setting, capturing the fan speed, capturing the volumetric airflow and storing for each of a number of PWM duty cycle values.

Example 126

This example includes the elements of example 125, wherein the number of PWM duty cycle values is related to a number of fan zones included in the cooling zone.

Example 127

This example includes the elements according to any one of examples 105 through 110, wherein at least one of the plurality of models is related to a plurality of cooling zone configurations.

Example 128

This example includes the elements according to any one of examples 1 through 3, wherein the configuration of the cooling zone is represented as a vector of numeric values.

Example 129

This example includes the elements of example 25, wherein the configuration of the cooling zone is represented as a vector of numeric values.

Example 130

This example includes the elements according to any one of examples 48 through 52, wherein the configuration of the cooling zone is represented as a vector of numeric values.

Example 131

This example includes the elements according to any one of examples 82 through 87, wherein the configuration of the cooling zone is represented as a vector of numeric values.

Example 132

This example includes the elements according to any one of examples 105 through 110, wherein the configuration of the cooling zone is represented as a vector of numeric values.

Example 133

This example includes the elements according to any one of examples 48 through 52, wherein at least one rack element corresponds to a variable configuration.

Example 134

A computer readable storage device having stored thereon instructions that when executed by one or more processors result in the following operations including the method according to any one of examples 25 to 47.

Example 135

A system including at least one device arranged to perform the method of any one of examples 25 to 47.

Example 136

A device including means to perform the method of any one of examples 25 to 47.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
   power thermal awareness solution (PTAS) circuitry to:
      receive information regarding a configuration for each of a plurality of cooling zones, each cooling zone including at least one fan, each cooling zone is associated with one or more devices;
      initiate a test procedure that includes:
         set a range of pulse width modulation (PWM) duty cycles for each fan in each cooling zone;
         determine, for each PWM duty cycle, a fan speed for each fan in each cooling zone; and
         determine, for each PWM duty cycle, a measured volumetric air flow associated with each cooling zone; and
      for each cooling zone,
         select an airflow prediction model from a plurality of airflow prediction models based at least in part on the measured volumetric airflow information for each cooling zone; and
         determine, during operation of each cooling zone and the associated one or more device, an operational volumetric airflow based at least in part on the selected airflow prediction model for the cooling zone; and
         cause a workload assigned to at least one of the one or more devices to be modified based on the operational volumetric airflow of each cooling zone.

2. The apparatus of claim 1, wherein the PTAS circuitry is further to identify the configuration of at least one of the plurality of cooling zones.

3. The apparatus of claim 1, wherein the PTAS circuitry is further to determine a cooling zone outlet temperature for each cooling zone based at least in part on the operational volumetric airflow for that cooling zone.

4. The apparatus of claim 1, wherein the PTAS circuitry is further to determine a power consumption associated with each cooling zone.

5. A method comprising:
   receiving, by power thermal awareness solution (PTAS) circuitry, information regarding a configuration for each of a plurality of cooling zones, each cooling zone including at least one fan, each cooling zone associated with one or more devices;
   initiating, by the PTAS circuitry, a test procedure that includes:
      set a range of pulse width modulation (PWM) duty cycles for each fan in each cooling zone;
      determine, for each PWM duty cycle, a fan speed for each fan in each cooling zone; and
      determine, for each PWM duty cycle, a measured volumetric airflow associated with each cooling zone; and
   selecting, by the PTAS circuitry, an airflow prediction model from a plurality of airflow prediction models for each cooling zone based at least in part on the measured volumetric airflow information for each cooling zone;
   determining, by the PTAS circuitry, during operation of each cooling zone and the associated one or more device, an operational volumetric airflow for each cooling zone based at least in part on the selected airflow prediction model; and
   causing, by the PTAS circuitry, a workload assigned to at least one of the one or more devices to be modified based on the operational volumetric airflow of each cooling zone.

6. The method of claim 5, further comprising identifying, by the PTAS circuitry, the configuration of each cooling zone.

7. The method of claim 5, further comprising determining, by the PTAS circuitry, a cooling zone outlet temperature for each cooling zone based at least in part on the volumetric airflow.

8. The method of claim 5, further comprising determining, by the PTAS circuitry, a power consumption associated with each cooling zone.

9. The method of claim 8, wherein the power consumption is related to an exponential moving average of a series of measured power consumption values.

10. A system comprising:
    a plurality of cooling zones, each cooling zone comprising at least one rack element and a fan zone comprising at least one fan; and
    a rack management controller (RMC) comprising:
       power thermal awareness solution (PTAS) circuitry to:
          receive information regarding a configuration of each of the plurality of cooling zones, each cooling zone is associated with one or more devices;
          initiate a test procedure that includes:
             set a range of pulse width modulation (PWM) duty cycles for each fan in each cooling zone;
             determine, for each PWM duty cycle, a fan speed for each fan in each cooling zone; and
             determine, for each PWM duty cycle, a measured volumetric airflow associated with each cooling zone; and
          select, for each cooling zone, an airflow prediction model from a plurality of airflow prediction models based at least in part on the measured volumetric airflow information for each cooling zone,
          determine, during operation of each cooling zone and the associated one or more device, an operational volumetric airflow for each cooling zone based at least in part on the selected airflow prediction model; and
          cause a workload assigned to at least one of the one or more devices to be modified based on the operational volumetric airflow for each cooling zone.

11. The system of claim 10, wherein the PTAS circuitry is further to identify the configuration of each cooling zone.

12. The system of claim 10, wherein the PTAS circuitry is further to determine a cooling zone outlet temperature for each cooling zone based at least in part on the operational volumetric airflow.

13. The system of claim 10, wherein the PTAS circuitry is further to determine a power consumption associated with each cooling zone.

14. The system of claim 10, wherein the at least one rack element comprises one or more of a compute component, a storage component, a networking component and a memory component.

15. The system of claim 10, wherein the selected airflow prediction model is related to a number of fan zones.

* * * * *